(12) United States Patent
Shimizu

(10) Patent No.: US 6,215,704 B1
(45) Date of Patent: Apr. 10, 2001

(54) SEMICONDUCTOR MEMORY DEVICE ALLOWING REDUCTION IN A NUMBER OF EXTERNAL PINS

(75) Inventor: Tadayuki Shimizu, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/564,675

(22) Filed: May 4, 2000

(30) Foreign Application Priority Data

Nov. 8, 1999 (JP) .................................................. 11-317096

(51) Int. Cl.$^7$ .................................................. G11C 16/04
(52) U.S. Cl. .................................. 365/189.02; 365/189.5; 365/230.02; 365/230.08
(58) Field of Search ........................ 365/189.02, 189.05, 365/230.02, 230.08, 189.01, 230.01

(56) References Cited

U.S. PATENT DOCUMENTS 4,939,692 * 7/1990 Kendall ........................... 365/189.03
5,249,160 * 9/1993 Wu et al. ........................ 365/230.08
5,587,957 * 12/1996 Kowalczyk et al. ............. 365/230.03
5,719,878 * 2/1998 Yu et al. .............................. 714/728
6,104,664 * 8/2000 Ohno ................................ 365/230.06

FOREIGN PATENT DOCUMENTS 4-328384    11/1992 (JP) .
6-76581     3/1994 (JP) .

* cited by examiner

*Primary Examiner*—David Nelms
*Assistant Examiner*—Hoai V. Ho
(74) *Attorney, Agent, or Firm*—McDermott, Will & Emery

(57) ABSTRACT

Multi-function pins are provided for executing input of address bits and input/output of data bits. Address input enable signal and data I/O enable signal supplied from independent pins determine one between the address input and the data input/output to be performed by the multi-function pin. One of an address register, a data input register and a data output register provided for each multi-function pin operate in response to a combination of signal levels of the address input enable signal and the data I/O enable signal.

12 Claims, 19 Drawing Sheets

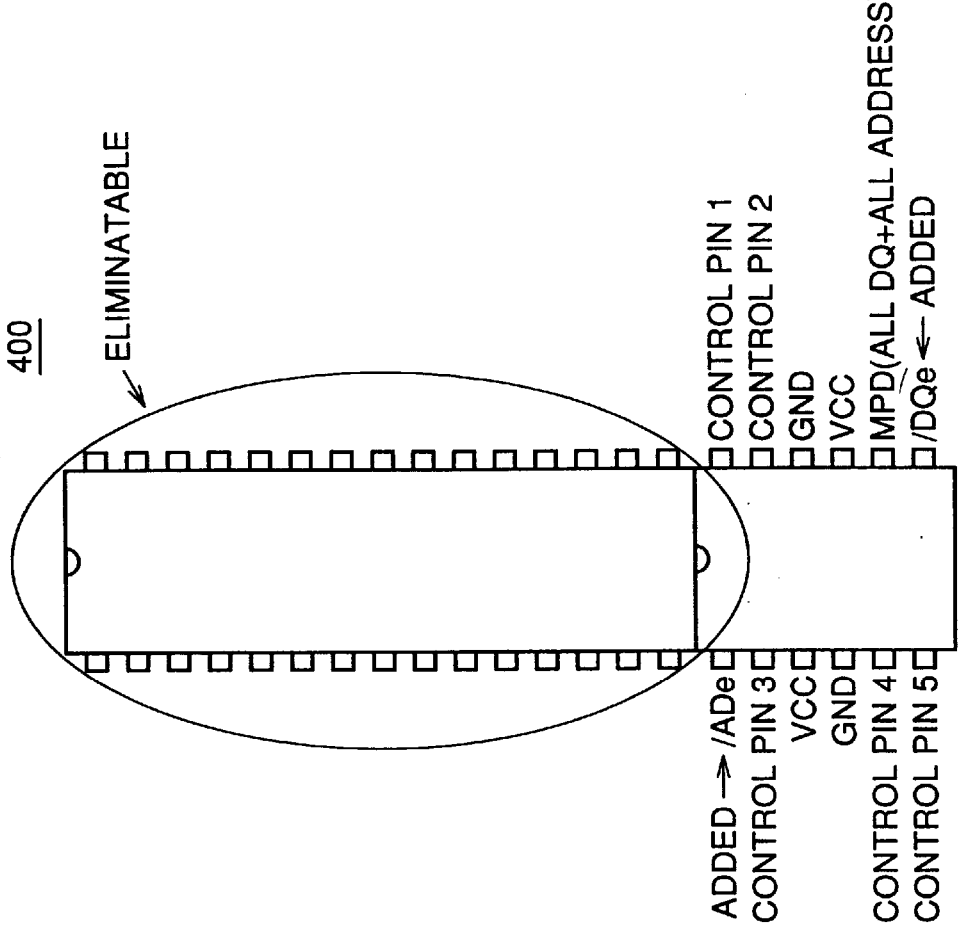
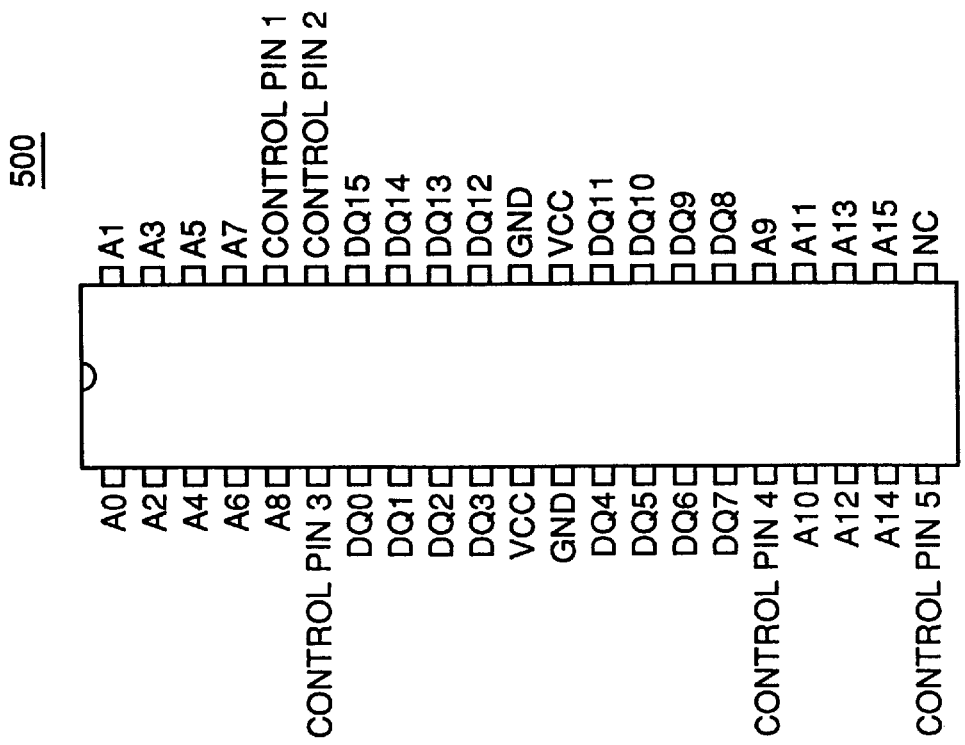
FIG.20A
FIG.20B

SEMICONDUCTOR MEMORY DEVICE ALLOWING REDUCTION IN A NUMBER OF EXTERNAL PINS

BACKGROUND OF THE INVENTION

1. Field of the Invention

The present invention relates to a semiconductor memory device, and particularly a semiconductor memory device allowing reduction in number of external pins which are employed for external transmission of signals.

2. Description of the Background Art

A semiconductor memory device performs input/output of data signals as well as storage thereof based on externally supplied control signals and address signals. These signals are transmitted via pins arranged on a chip.

FIG. 26 shows a pin arrangement of a conventional semiconductor memory device 500.

A pin arrangement of a non-synchronous SRAM (Static Random Access Memory) is shown in FIG. 26 as an example of a pin arrangement of a conventional semiconductor memory device.

Referring to FIG. 26, control pins 1–5 are employed for input of control signals such as a chip select signal, a write control input signal and an output enable signal. Address pins A0–A15 are provided for input of respective bits of an address signal. In the following description, each bit of the address signal may also be referred to as an "address bit". DQ1–DQ15 indicate DQ pins for input/output of the respective bits of an I/O data signal. In the following description, each bit of the I/O data signal may also be referred to as a "data bit".

In semiconductor memory device 500, the I/O data signal of 16 bits are externally read or written in response to the address signal of 16 bits.

Semiconductor memory device 500 further includes pins for receiving a ground potential VSS and a power supply voltage VCC, respectively. A pin indicated by "NC" is an unconnected pin.

In the conventional semiconductor memory device, as described above, the independent pins are provided for the signals of different functions, respectively.

However, capacities and functions of the memory devices have been improved. This results in increase in number of the bits of the address signal for selecting the memory cell and the bits of the I/O data signal which are simultaneously input/output, and also results in disadvantages such as increase of the control signals due to addition of control functions. Thereby, the device employs more pins, which increases a chip size of the device. Conversely, semiconductor memory devices such as an asynchronous SRAM have been employed in many devices such as portable telephones. For such employment, it is important to reduce a layout area.

With increase in pin number, the pins which operate simultaneously with each other increase in number, and therefore such a problem arises in the input buffer circuit, which receives data supplied through the pins, that the sum of consumed currents increases due to through-currents of transistors forming an input first stage.

SUMMARY OF THE INVENTION

An object of the invention is to provide a semiconductor memory device, which is provided with pins having integrated functions of address pins and data I/O pins, and thereby can reduce a total number of pins so that increase in chip size can be suppressed even in a structure having an increased capacity and improved functions.

In summary, a semiconductor memory device for performing input/output of a data signal of M bits (M: natural number) in response to an address signal of N bits (N: natural number) includes a memory cell array, an address decode circuit, a data I/O circuit, a plurality of multi-function terminals, a first control terminal, a second control terminal, a plurality of address register circuits and a plurality of data register circuits.

The memory cell array has a plurality of memory cells arranged in rows and columns. The address decode circuit selects the memory cells of M in number from the plurality of memory cells in response to a combination of the respective bits of the address signal. The data I/O circuit performs data input/output with respect to the selected m memory cells. The plurality of multi-function terminals are commonly used by the input of the address signal and the input/output of the data signal. The first control terminal receives a first control signal for instructing input of the address signal to the plurality of multi-function terminals. The second control terminal receives a second control signal for instructing input/output of the data signal to the plurality of multi-function terminals. The plurality of address register circuits are provided between the plurality of multi-function terminals and the address decode circuit, respectively, and each respond to activation of the first control signal by taking in the level of the signal supplied to the corresponding one of the plurality of multi-function terminal, and transmitting the level to the address decode circuit. The plurality of data register circuits are provided between the plurality of multi-function terminals and the data I/O circuit, respectively, and each respond to the activation of the second control signal by transmitting the data signal between the corresponding one of the plurality of multi-function terminals and the data I/O circuit.

Accordingly, a major advantage of the invention is that the pins can be reduced in total number because the structure is provided with the multi-function terminals or pins which can execute both the input of the address signal and the input/output of the I/O data signal. Consequently, the chip size of the semiconductor memory device can be reduced.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 20A and 20B are chip external views showing pin arrangements of a semiconductor memory device 400 according to a fourth embodiment of the invention;

DESCRIPTION OF THE PREFERRED EMBODIMENTS

Embodiments of the invention will now be described in detail with reference to the drawings. In the figures, the same or corresponding portions bear the same reference numbers.
First Embodiment As an embodiment of the invention, description will now be given on a structure of a semiconductor memory device which allows integration of functions of address pins and DQ pins. The first embodiment, which will now be described, is suitable to a structure, in which bits of an address signal is equal in number to bits of an I/O data signal.

Figure 1B:
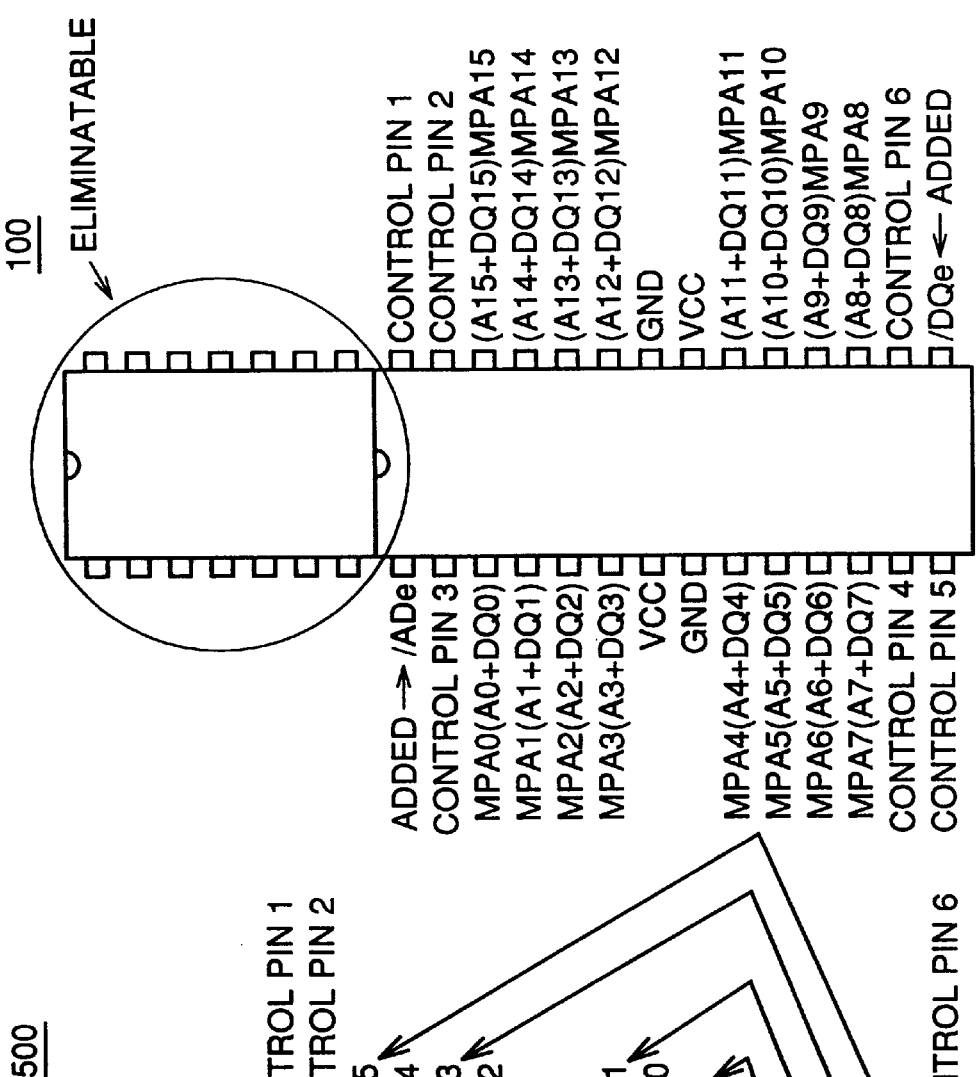
FIGS. 1A and 1B are external views of a chip showing pin arrangements of a semiconductor memory device 100 according to a first embodiment.
Figure 1A:
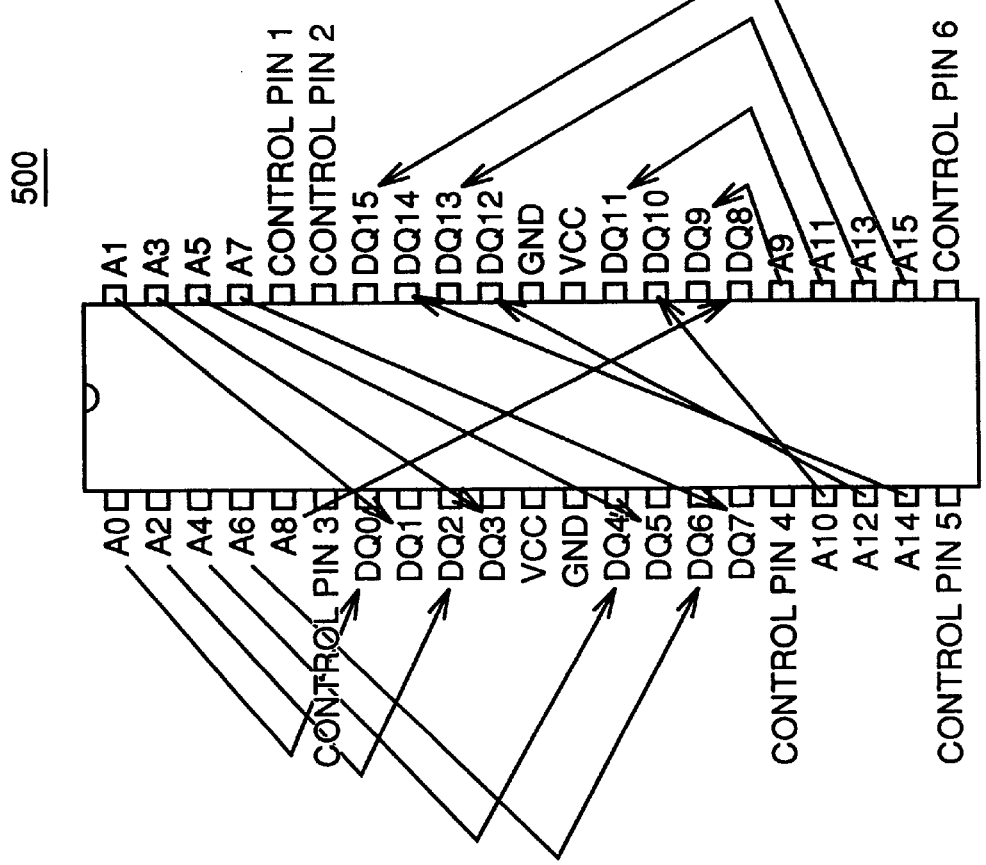

FIGS. 1A and 1B show pin arrangements of asynchronous SRAMs as examples of a general semiconductor memory device.

FIG. 1A shows a pin arrangement of a semiconductor memory device 500 in the prior art for comparison. In semiconductor memory device 100 according to the first embodiment, there are arranged multi-function pins each corresponding to a pin set including one address pin and one DQ pin among the address pins and the DQ pins, which are equal in number to the address pins, and having integrated functions of these address pin and DQ pin.

As shown in FIG. 1B, multi-function pins MPA0–MPA15 are employed instead of address pins A0–A15 and DQ pins DQ0–DQ15. Each of multi-function pins MPA0–MPA15 executes input of one address bit and input/output of one data bit.

For example, multi-function pin MPA0 handles an address bit to be supplied to address pin A0 and a data bit to be input/output via DQ pin DQ0. Other multi-function pins MPA1–MPA15 operate to input the data bits for the corresponding address pins and input/output the data for the corresponding DQ pins, respectively.

Semiconductor memory device 100 further includes pins for receiving address input enable signal/ADe and data I/O enable signal/DQe instructing the address input or the data input/output, which is to be actually performed by each multi-function pin.

Address input enable signal/ADe is a signal which is activated to attain L-level when input of the address signal is to be executed by each multi-function pin. Data I/O enable signal/DQe is a signal which is activated to attain L-level when input/output of the data is to be executed by each multi-function pin.

In the example shown in FIGS. 1A and 1B, since the functions of the address input pin and the data input/output pin are integrated in the multi-function pin, two pins are additionally required for receiving address input enable signal/ADe and data I/O enable signal/DQe, but the address pins and the data I/O pins can be reduced by 16 so that the pins can be reduced by 14 in total number.

Description will now be given on the internal structure of semiconductor memory device 100, which can execute the address input and the data input/output via the multi-function pins.

Figure 2A:
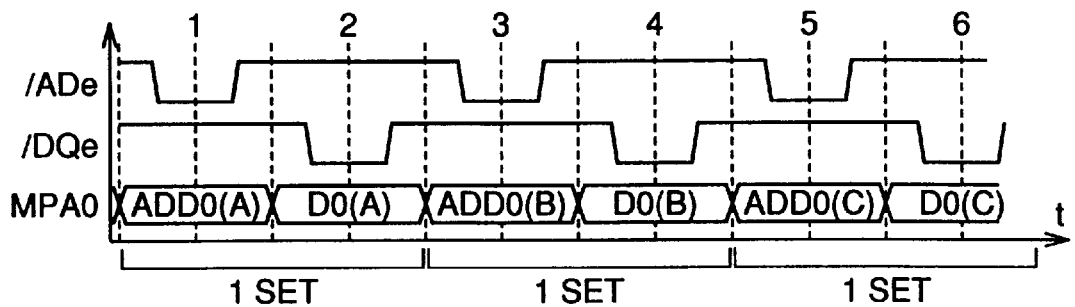
FIGS. 2A and 2B are timing charts showing address input and data write/read of semiconductor memory device 100.
Figure 2B:
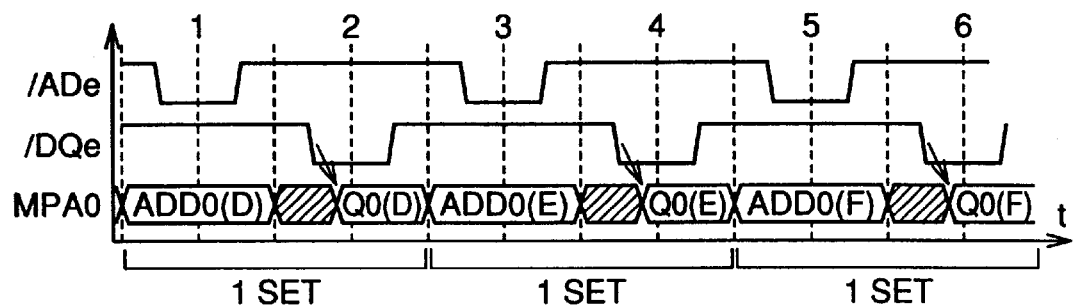

With reference to FIGS. 2A and 2B, the input/output operations via multi-function pin MPA0 will now be described as a typical example.

In the following description, timing at which each of address input enable signal/ADe and data I/O enable signal/DQe is externally activated will be referred to as a "rate". At each rate, each multi-function pin handles one of the address bit and the data bit depending on the signal level of these enable signals.

FIG. 2A is a timing chart showing the address input and data input/output for the data write operation.

At the first rate, address input enable signal/ADe is activated, and the multi-function pins receive the bits of address signal ADD(A), respectively. Multi-function pin MPA0 receives address bit ADD0(A) in address signal ADD(A).

At the second rate, data I/O enable signal/DQe is activated at the second rate. Thereby, multi-function pins MPA0–MPA15 receive the bits of data signal D(A) to be written into the memory array in accordance with address signal ADD(A), respectively. Multi-function pin MPA0 receives data bit D0(A) in data signal D(A).

At the third rate, address input enable signal/ADe is activated again. Thereby, the multi-function pins receive the respective bits of address signal ADD(B), and multi-function pin MPA0 receives address bit ADD0(B).

Thereby, data I/O enable signal/DQe is activated at the fourth rate so that data signal D(B) corresponding to address signal ADD(B) is supplied, and multi-function pin MPA0 receives data bit D0(B).

At the fifth and sixth rates, input of address signal ADD(C) and input of corresponding data signal D(C) are performed similarly to the above operations, respectively.

The address input and data input/output in the data read operation will now be described with reference to FIG. 2B.

Referring to FIG. 2B, address input enable signal/ADe is activated at the first rate. In response to this activation, the multi-function pins receive address signal ADD(D), and multi-function pin MPA0 receives address bit ADD0(D) in address signal ADD(D).

Subsequently, data I/O enable signal/DQe is activated at the second rate so that the read operation is executed on the memory cell array, and data signal Q(D) corresponding to address signal ADD(D) is issued from the respective multi-function pins. Data bit Q0(D) in data signal Q(D) is issued from multi-function pin MPA0.

Likewise, input of address signal ADD(E) and reading of corresponding data signal Q(E) are executed at the third and fourth rates, respectively. At the fifth and sixth rates, input of address signal ADD(F) and reading of corresponding data signal Q(F) are executed, respectively.

The input of corresponding address bits and input/output of the data bits are likewise performed via the other multi-function pins, respectively. Consequently, semiconductor memory device 100 handles two rates as one set when it performs the data write and read operations.

Figure 3:
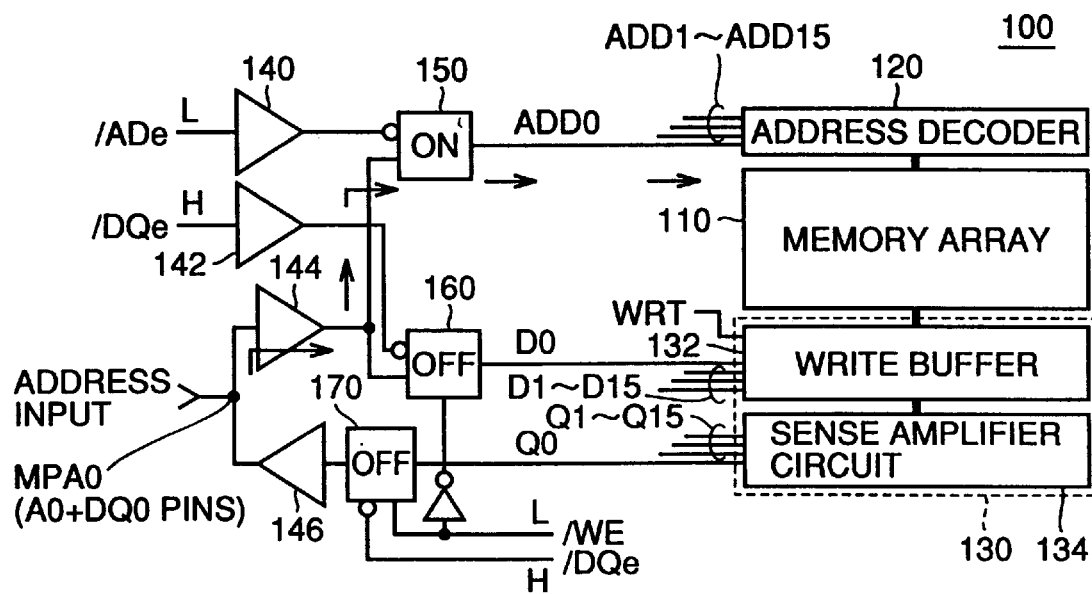
FIG. 3 is a schematic block diagram showing a whole structure of semiconductor memory device 100 and signal transmission paths in an address input operation.

FIG. 3 is a schematic block diagram showing a whole structure of semiconductor memory device 100 according to the first embodiment and the signal transmission paths in the address input operation. FIG. 3 shows, as a typical example, the multi-function pin MPA0 and corresponding circuits.

A whole structure of semiconductor memory device 100 will now be described.

Referring to FIG. 3, semiconductor memory device 100 includes a memory array 110 having a plurality of memory cells arranged in rows and columns, and an address decoder 120 for selecting the memory cell in memory cell array 110 in response to respective bits ADD0–ADD15 of the address signal. Address decoder 120 has a function of selecting 16 memory cells in memory cell array 110 in response to the input of one address signal. For example, although not shown specifically in the figure, memory array 110 is divided into 16 sub-arrays, and the memory cell is selected in each sub-array in response to a combination of bits ADD0–AD15 of the address signal so that the 16 memory cells can be selected in memory array 110 in response to address bits ADD0–ADD15.

Semiconductor memory device 100 further includes a data I/O circuit 130 for writing data bits D0–D15 into the memory cells selected in memory array 110 and reading data bits Q1–Q15 from these selected memory cells. Data I/O circuit 130 includes a write buffer 132 which is controlled by a write control signal WRT to write respective data bits D0–D15 of the supplied data signal into the selected memory cells in memory array 110, and a sense amplifier circuit 134 which amplifies stored data read from the selected memory cells in memory array 110 for issuing data bits Q0–Q15.

Semiconductor memory device 100 further includes a buffer 140 receiving address input enable signal/ADe, a buffer 142 receiving data I/O enable signal/DQe, an input buffer 144 receiving the signals supplied to the multi-function pins, and an output buffer 146 issuing data to be sent from the multi-function pins.

Semiconductor memory device 100 further includes an address register 150 which operates when the address input enable signal/ADe is active (at L-level), and thereby transmits to address decoder 120 the signal level supplied from multi-function pin MPA0 via input buffer 144, as address bit ADD0.

Semiconductor memory device 100 further includes a data input register 160 and a data output register 170, which respond to data I/O enable signal/DQe and I/O control signal/WE.

I/O control signal/WE indicates which of data reading and data writing is to be executed in the data I/O operation. The signal level of I/O control signal/WE is set to L-level for the data write operation, and is set to H-level for the data read operation.

Data input register 160 operates when data I/O enable signal/DQe is active (at L-level) and I/O control signal/WE is at L-level, and thereby transmits to write buffer 132 the input signal level supplied from multi-function pin MPA0 via input buffer 144, as data bit D0.

Data output register 170 operates when data I/O enable signal/DQe is active (at L-level) and I/O control signal/WE is at H-level, and thereby issues data bit Q0, which is sent from sense amplifier circuit 134, to multi-function pin MPA0 via output buffer 146.

In FIG. 3, arrows indicate signal paths in the address input operation. In the address input operation, address input enable signal/ADe is active (L-level), and data I/O enable signal/DQe is inactive (H-level) so that address register 150 is on, and data input register 160 and data output register 170 are off. Accordingly, the signal supplied to multi-function pin MPA0 is transmitted, as address bit ADD0, to address decoder 120 by input buffer 144 and address register 150.

For other multi-function pins MPA1–MPA15, there are likewise arranged address registers, data input registers and data output registers. Owing to the structure described above, address decoder 120 can receive address bits ADD0–ADD15 via multi-function pins MPA0–MPA15, respectively. Likewise, data bits D0–D15 and Q0–Q15, which are processed by data I/O circuit 130 for input/output with respect to memory array 110, are externally transmitted via multi-function pins MPA0–MPA15.

Figure 4:
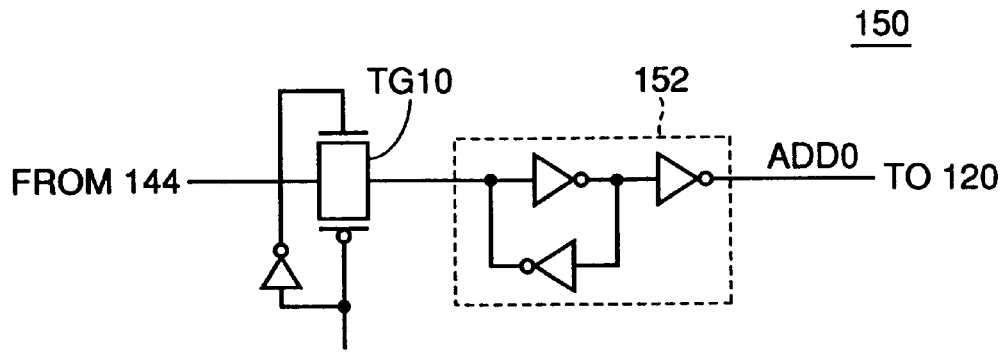
FIG. 4 is a circuit diagram showing a structure of an address register 150.

FIG. 4 is a circuit diagram showing a structure of address register 150.

Referring to FIG. 4, address register 150 includes a transfer gate TG10 which transmits the signal level issued from input buffer 144 to a latch circuit 152 in response to address input enable signal/ADe, and latch circuit 152 which holds the signal level transmitted from transfer gate TG10, and issues it as address bit ADD0. Owing to this structure, address bit ADD0 supplied to multi-function pin MPA0 can be transmitted to address decoder 120 at the rate of activation of address input enable signal/ADe.

Address decoder 120 likewise receives the address bits from the address registers provided for the other multi-function pins, respectively, and selects the memory cells for read/write operation in memory array 110 in response to address bits ADD0–ADD15.

Figure 5:
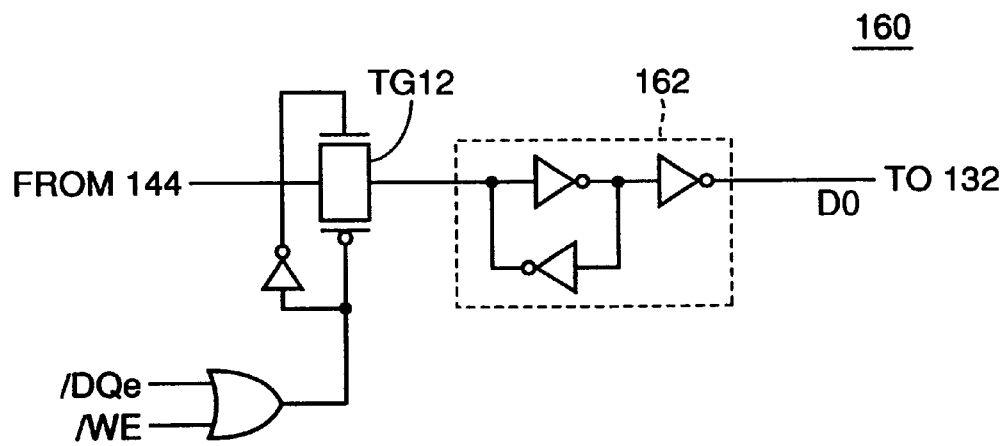
FIG. 5 is a circuit diagram showing a structure of a data input register 160.

Referring to FIG. 5, data input register 160 includes a transfer gate TG12 which transmits the signal level issued from input buffer 144 to a latch circuit 162 in response to data I/O enable signal/DQe and I/O control signal/WE, and latch circuit 162 which issues, as data bit D0, the signal level transmitted from transfer gate TG12.

Data input register 160 takes in the signal level issued from input buffer 144 for holding it in latch circuit 162 when data I/O control signal/WE is set to L-level instructing the data writing at the rate of activation (L-level) of data I/O enable signal/DQe. As a result, data bit D0 supplied to multi-function pin MPA0 in the data write operation can be transmitted to write buffer 132.

In a similar manner, write buffer 132 receives data bits from data input registers, which are provided for the other multi-function pins and have similar structures, respectively. Thereby, write buffer 132 writes data bits D0–D15 into the memory cells selected by address decoder 120 in memory array 110.

Figure 6:
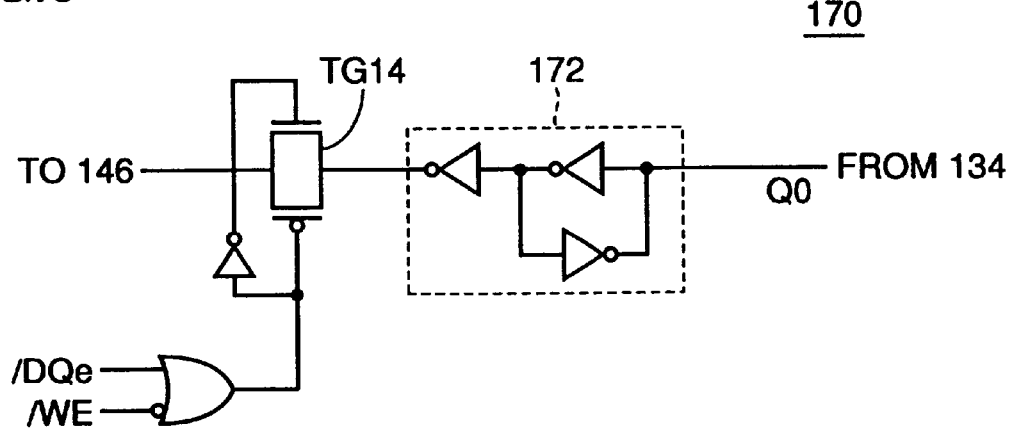
FIG. 6 is a circuit diagram showing a structure of a data output register 170.

Referring to FIG. 6, data output register 170 includes a latch circuit 172 which holds the signal level of data bit Q0 of the read data issued from sense amplifier circuit 134, and a transfer gate TG14 which transmits the data held by latch circuit 172 to output buffer 146 in response to data I/O enable signal/DQe and I/O control signal/WE.

Data output register 170 takes in the signal level issued from sense amplifier circuit 134, and holds it by latch circuit 172. The data held by latch circuit 172 is issued to multi-function pin MPA0 via output buffer 146 when data I/O control signal/WE is set to H-level instructing the data reading at the rate of activation (L-level) of data I/O enable signal/DQe. As a result, multi-function pin MPA0 can issue data bit Q0 issued from sense amplifier circuit 134 in the data read operation.

In a similar manner, sense amplifier circuit 134 issues data bits to data output registers, which are provided for the other multi-function pins and have similar structures, respectively. Thereby, data bits Q0–Q15 read from the memory cells selected by address decoder 120 are issued from the corresponding multi-function pins, respectively.

Figure 7A:
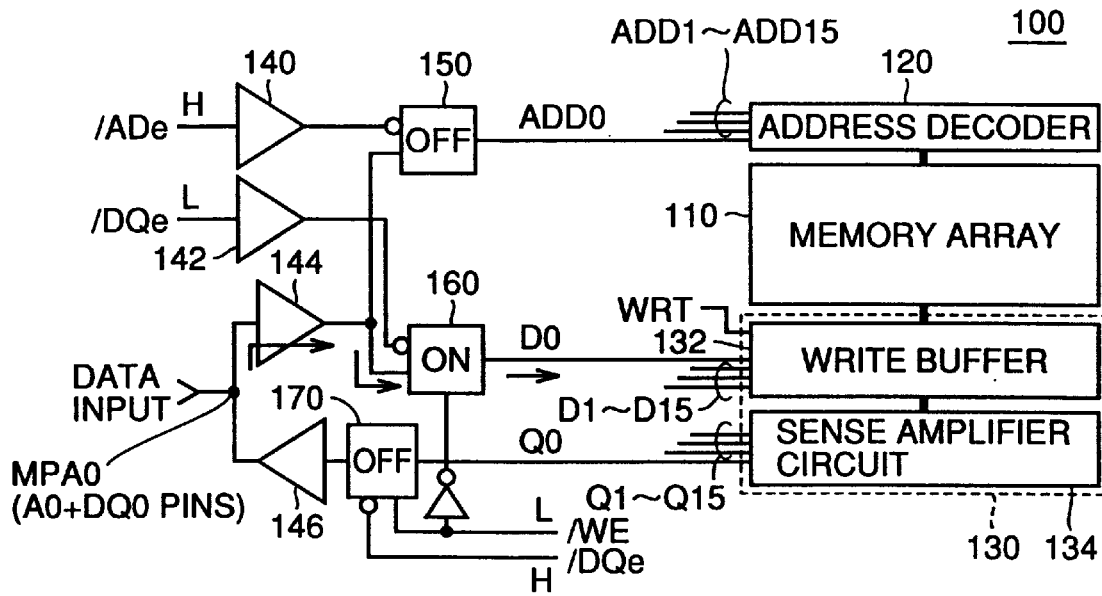
FIGS. 7A and 7B are block diagrams showing signal transmission paths in a data input operation of semiconductor memory device 100.

FIG. 7A shows flows of signals in the data write operation of semiconductor memory device 100. In the data write operation, address input enable signal/ADe is deactivated to attain H-level, and data I/O enable signal/DQe is activated to attain L-level. I/O control signal/WE for executing writing into the memory array is set to L-level.

In response to the above, data I/O register 160 is turned on, and address register 150 and data output register 170 are turned off. In the data write operation, therefore, the signal supplied to multi-function pin MPA0 is transmitted, as data bit D0, to write buffer 132 via input buffer 144 and data input register 160.

Similar operations are performed on multi-function pins MPA1–MAP15 other than multi-function pin MPA0 by the corresponding data input registers, respectively. As a result, the signals supplied via multi-function pins MPA0–MPA15 are written, as data bits D0–D15, into the memory array in the data write operation, in which data I/O control signal/WE is set to L-level, at the rate of activation (L-level) of data I/O enable signal/DQe.

Figure 7B:
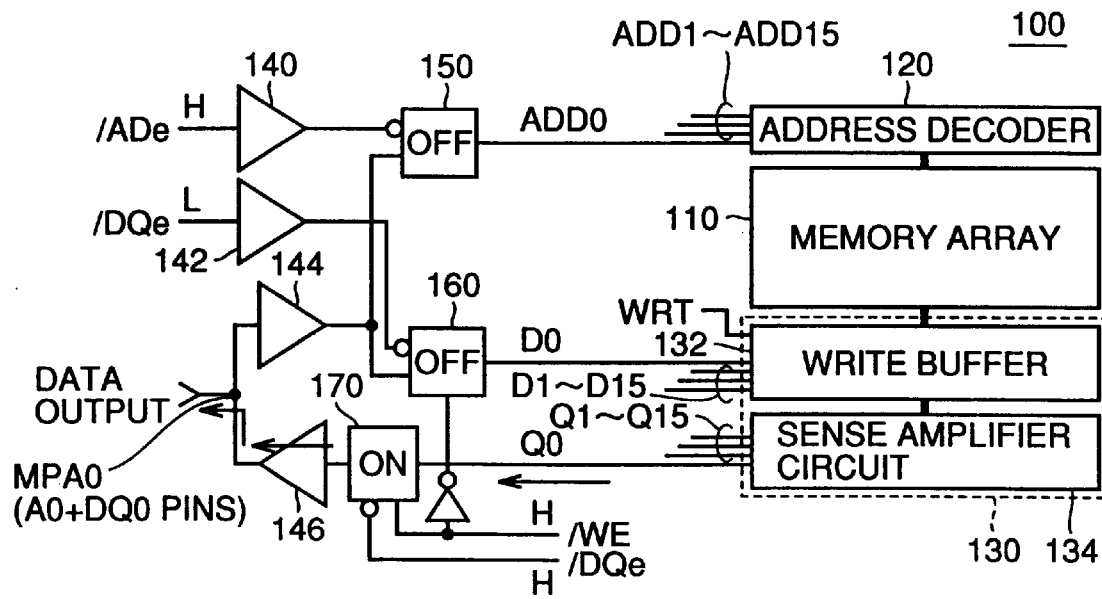

FIG. 7B shows signal paths in the data read operation of semiconductor memory device 100.

In the data read operation, address input enable signal/ADe is set to the inactive state (H-level) and data I/O enable signal/DQe is set to the active state (L-level), similarly to the data write operation. However, I/O control signal/WE is set to H-level for instructing the memory array read operation.

In response to this, data input register 160 and data output register 170 change their states. Thus, data output register 170 is turned on, and data input register 160 is turned off.

Address register 150 is still kept off. In the data output operation, therefore, data bit Q0 read by sense amplifier circuit 134 is issued from multi-function pin MPA0 via data output register 170 and output buffer 146.

In multi-function pins MPA1–MPA15 other than multi-function pin MPA0, the corresponding data output registers perform similar operations, respectively. In the data read operation, therefore, data bits Q0–Q15 are issued from multi-function pins MPA0–MPA15 at the rate where data I/O control signal/WE is set to H-level and data I/O enable signal/DQe is activated to attain L-level.

The first embodiment has been described with reference to the structure, wherein the bits of the address signal are equal in number to the bits of the I/O signals. The first embodiment can be applied to cases other than the above. Thus, the structures of the multi-function pins and the register circuits in the first embodiment can also be applied to such a structure that the multi-function pin is employed for integrating the function of inputting the one address bit and the function of performing input/output of the one data bits, even if the bits of the address signal are different in number from the bits of the I/O data signal.

In the invention, address input enable signal/ADe and data I/O enable signal/DQe are externally applied as independent control signals, respectively. Therefore, functions of the address pin and the DQ pin can be integrated even in an asynchronous semiconductor memory device.

Second Embodiment

As a second embodiment, description will now be given on the case where the address signal is larger in number bits of from than the I/O data signal, and particularly will be given on structures of the multi-function pins, which can handle the address signal and the I/O data signal in an effectively integrated manner, as well as register circuits provided corresponding to the respective multi-function pins.

Figure 8B:
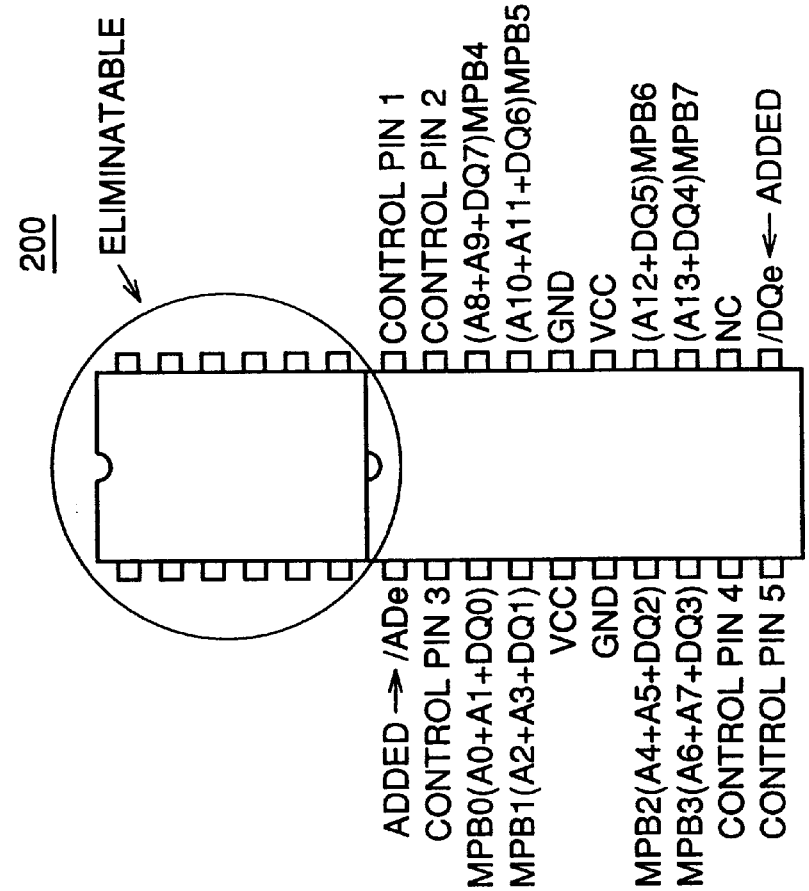
FIGS. 8A and 8B are chip external views showing pin arrangements of a semiconductor memory device 200 according to a second embodiment.
Figure 8A:
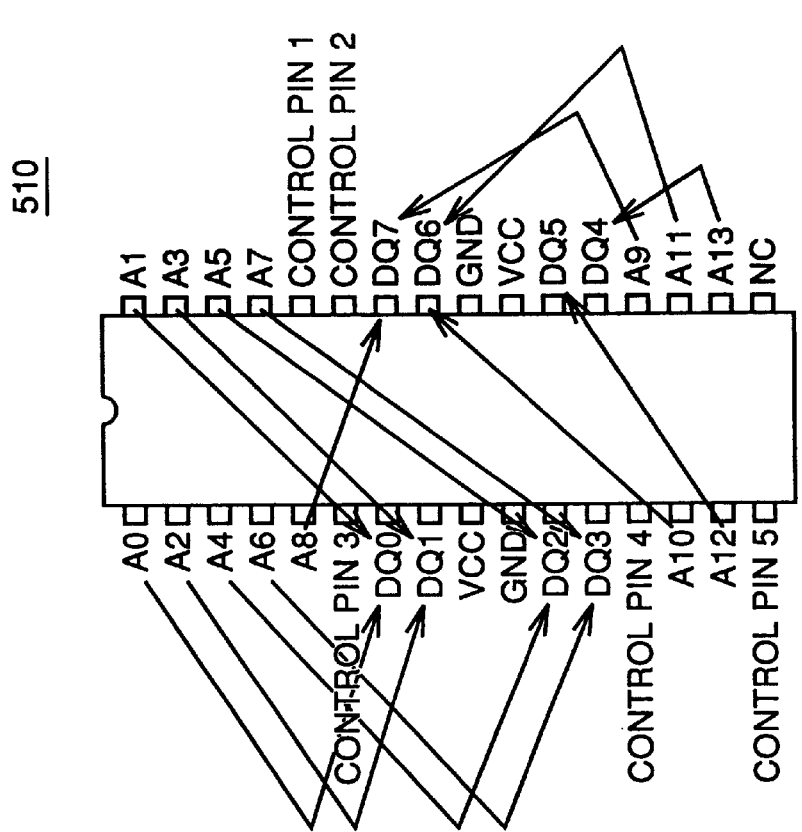

FIG. 8A shows, for comparison, a pin arrangement of a semiconductor memory device 510 in the prior art, which executes input/output of data signal of 8 bits via DQ pins DQ0–DQ7 in response to an address signal of 14 bits supplied through address pins A0–A13. A semiconductor memory device 200 according to the second embodiment has such a distinctive feature that the functions of two address pins and one DQ pin are integrated in the single multi-function pin.

As shown in FIG. 8B, address pins A0–A13 and DQ pins DQ0–DQ7 are replaced with multi-function pins MPB0–MPB7. Each of multi-function pins MPB0–MPB5 executes input of two address bits and input/output of one data bit. For example, multi-function pin MPB0 handles address bits to be supplied to address pins A0 and A1 as well as a data bit to be input/output by DQ pin DQ0. The address bits are 14 in number, and the multi-function pins are 8 in number so that multi-function pins MPB6 and MPB7, each of which receives only one address bit, are present together with multi-function pins MPB0–MPB5 each receiving two address bits.

Similarly to semiconductor memory device 100, semiconductor memory device 200 further includes pins for receiving address input enable signal/ADe and data I/O enable signal/DQe.

In the example shown in FIGS. 8A and 8B, the functions of the address input pins and the data I/O pins are integrated in the multi-function pins. Therefore, the pins for inputting address input enable signal/ADe and data I/O enable signal/DQe increase by two, but the address pins and the data I/O pins can be reduced by 14 so that the total number of the pins can be reduced by 12.

As a typical example, input/output operations via multi-function pin MPB0 receiving two address bits and multi-function pin MPB6 receiving one address bit among the eight multi-function pins will now be described with reference to FIGS. 9A and 9B.

Figure 9A:
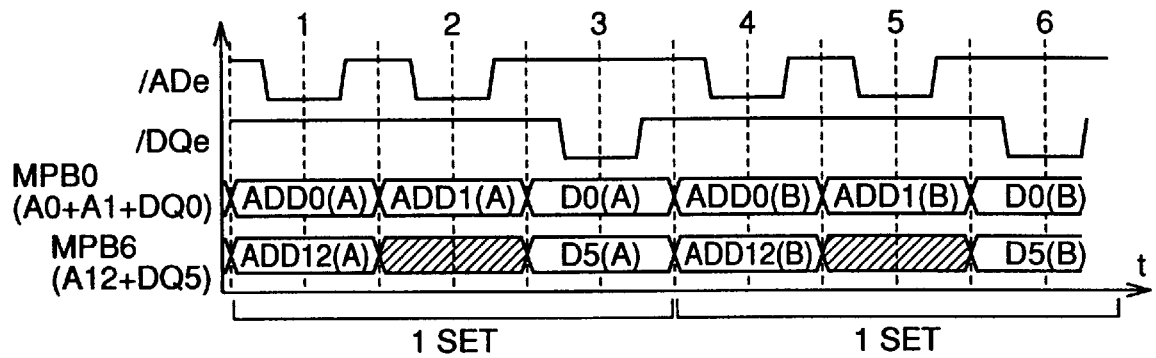
FIGS. 9A and 9B are timing charts showing address input and data input/output in semiconductor memory device 200.

FIG. 9A is a timing chart showing address input and data input/output of semiconductor memory device 200 in the data write operation.

At the first rate, address input enable signal/ADe is activated, and each multi-function pin is supplied with a part of address bits of address signal ADD(A). Multi-function pin MPB0 receives address bit ADD0(A) in address signal ADD(A), and multi-function pin MPB6 receives address bit ADD12(A).

At the second rate, address input enable signal/ADe is activated again so that the remaining address bits of address signal ADD(A) are supplied to the multi-function pins. Multi-function pin MPA0 receives address bit ADD1(A) in address signal ADD(A). However, multi-function pin MPB6 does not receive the address bit at this rate because only one address bit is assigned to multi-function pin MPB6.

At the third rate, data I/O enable signal/DQe is activated so that multi-function pins MPB0–MPB7 are supplied with the respective bits of data signal D(A) to be written in accordance with address signal ADD(A). Multi-function pin MPB0 receives data bit D0(A) of data signal D(A), and multi-function pin MPB6 receives data bit D5(A).

At the fourth and fifth rates, input of address signal ADD(B) is performed in a similar manner, and corresponding input of data signal D(B) is performed at the sixth rate in a similar manner.

Figure 9B:
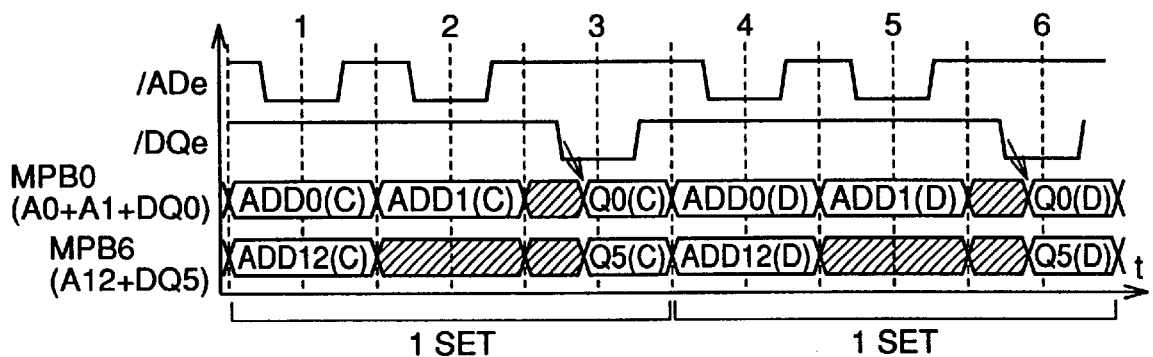

Referring to FIG. 9B, description will now be given on address input and data input/output of semiconductor memory device 200 in the data write operation.

Referring to FIG. 9B, address input enable signal/ADe is activated at the first rate, and multi-function pins receive a portion of the address bits of address signal ADD(C) for the read operation. Multi-function pin MPB0 receives address bit ADD0(C) of address signal ADD(C), and multi-function pin MPB6 receives address bit ADD12(C).

When address input enable signal/ADe is activated again at the second rate, the remaining multi-function pins receive address bit ADD1(C) of address signal ADD(C). However, multi-function pin MPB6 does not receive the address bit at this rate, similarly to the data write operation, because only one address bit is assigned to multi-function pin MPB6.

When data I/O enable signal/DQe is then activated at the third rate, the read operation is performed on the memory cell array, and data signal Q(C) corresponding to address signal ADD(C) is issued from the multi-function pins. Multi-function pin MPB0 issues data bit Q0(C) of data signal Q(C), and multi-function pin MPB6 issues data bit Q5(C).

At the fourth and fifth rates, input of address signal ADD(D) for read operation is likewise performed, and output of data signal Q(D) corresponding to it is performed at the sixth rate.

The other multi-function pins perform the input of the corresponding address bits and the input/output of the data bits in a similar manner. As a result, semiconductor memory device 200 executes the data write operation and the data read operation handling the three rates as one set.

Figure 10:
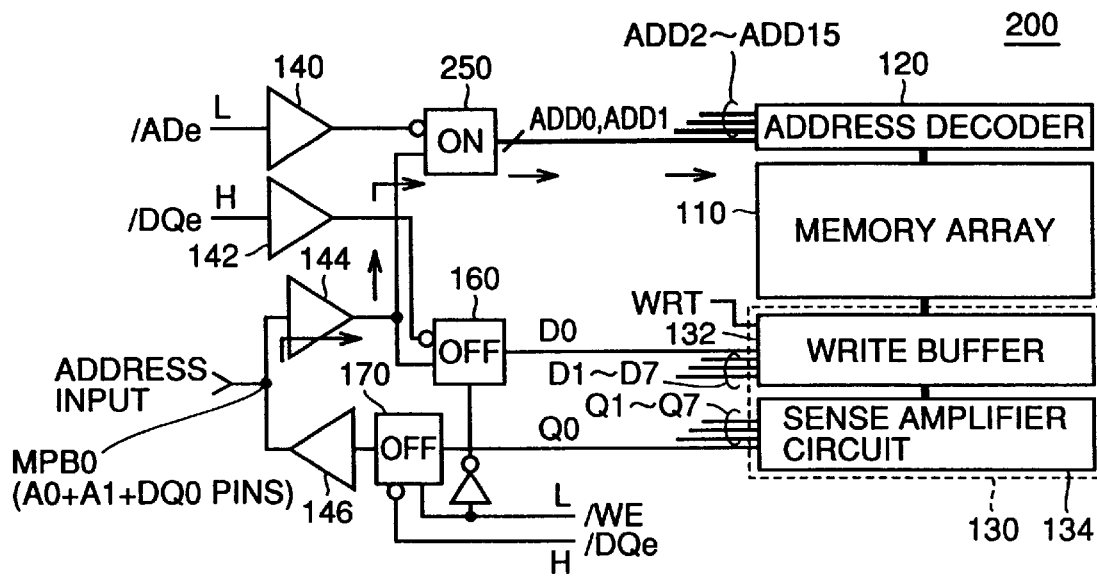
FIG. 10 is a schematic block diagram showing a whole structure of semiconductor memory device 200 and signal transmission paths in an address input operation.

FIG. 10 shows, as a typical example, multi-function pin MPB0 among the multi-function pins and circuits relating to it.

Referring to FIG. 10, semiconductor memory device 200 according to the second embodiment differs from semiconductor memory device 100 of the first embodiment in that an address register 250 is employed instead of address register 150.

Address register 250 is provided for such a feature that multi-function pin MPB0 receives two address bits. The other circuit structures and operation of semiconductor memory device 200 are the same as those of semiconductor memory device 100 except for the number of data bits which are input and output by the write buffer and the sense amplifier circuit, and therefore description thereof is not repeated.

Figure 11:
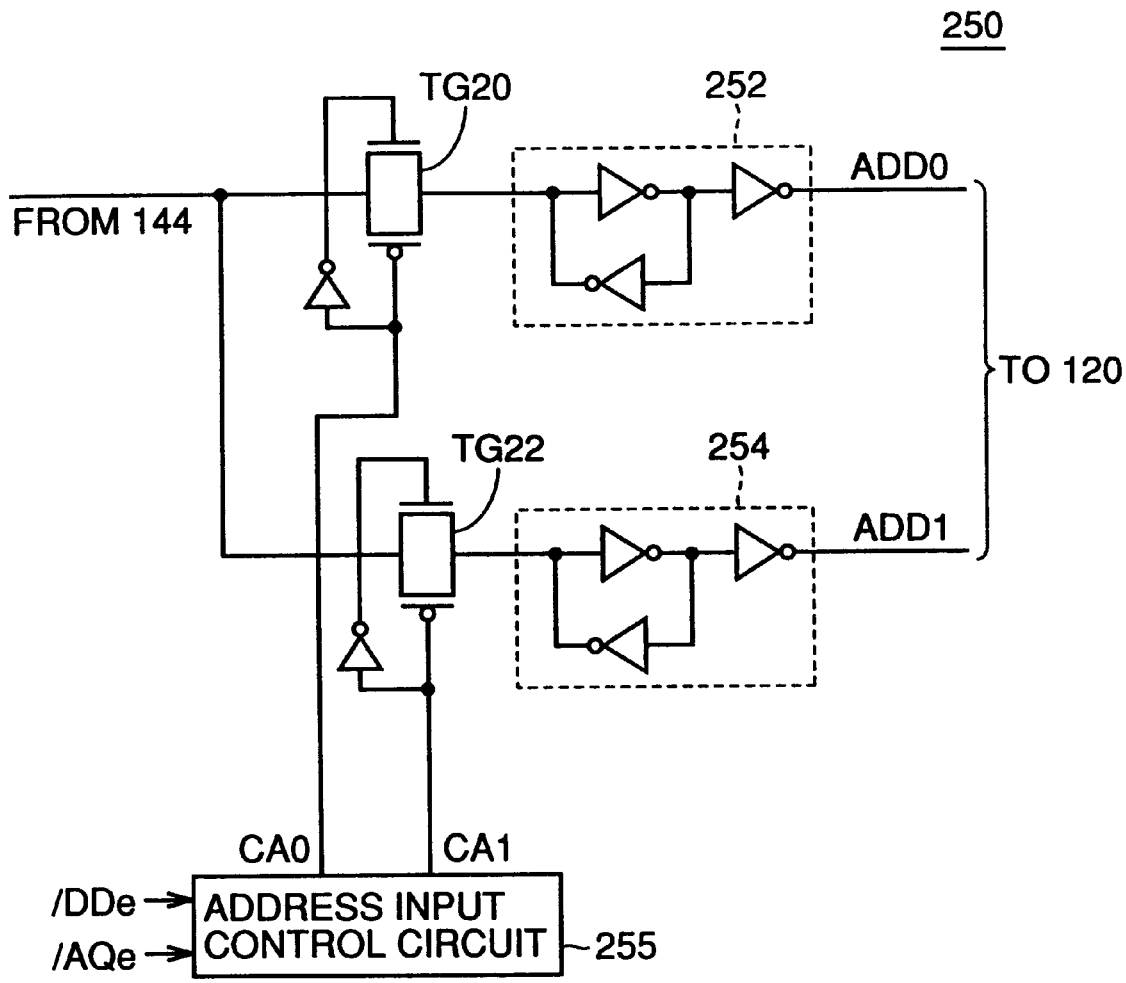
FIG. 11 is a circuit diagram showing a structure of an address register 250.

FIG. 11 shows a structure of address register 250 provided corresponding to multi-function pin MPB0.

Referring to FIG. 11, address register 250 includes two address registers arranged in parallel and each corresponding to address register 150 shown in FIG. 4.

Address register 250 includes transfer gates TG20 and TG22, which are connected between the node receiving the signal supplied via input buffer 144 from multi-function pin MPB0 and latch circuits 252 and 254, respectively, and latch circuits 252 and 254 for holding the signal levels transmitted from transfer gates TG20 and TG22, respectively.

Latch circuits 252 and 254 issue, as address bits ADD0 and ADD1, the signal levels held by them, respectively.

Address register 250 further includes an address input control circuit 255, which issues control signals CA0 and CA1 for controlling on/off of transfer gates TG20 and TG22, respectively.

In response to address input enable signal/ADe and data I/O enable signal/DQe, address input control circuit 255 turns on transfer gate TG20 when multi-function pin MPA0 receives address bit ADD0, and turns on transfer gate TG22 when multi-function pin MPA0 receives address bit ADD1.

Figure 12:
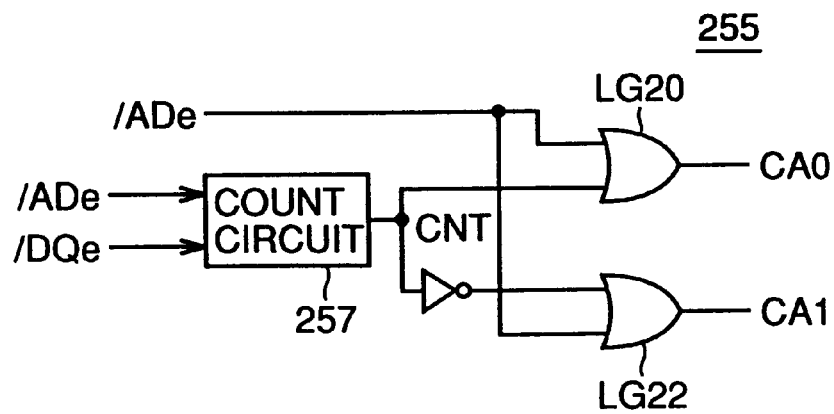
FIG. 12 is a circuit diagram showing a structure of an address input control circuit 255.

FIG. 12 is a circuit diagram showing a structure of address input control circuit 255.

Referring to FIG. 12, address input control circuit 255 includes a count circuit 257 which receives address input enable signal/ADe and data I/O enable signal/DQe, and issues a count signal CNT, a logic gate LG20 issuing control signal CA0 and a logic gate LG22 issuing control signal CA1.

Count circuit 257 issues a count signal CNT of one bit for distinguishing address bits in the address input operation. Count circuit 257 clears count signal CNT to set it to L-level upon every activation of data I/O enable signal/DQe, and increments the count when address input enable signal/ADe is deactivated to attain H-level after it was activated to attain L-level. Thus, the signal level of count signal CNT (1 bit) is inverted.

When both address input enable signal/ADe and count signal CNT are at L-level, logic gate LG20 sets control signal CA0 to the active state (L-level) to turn on transfer gate TG20. Logic gate LG22 sets control signal CA1 to the active state (L-level) to turn on transfer gate TG22 when address input enable signal/ADe is at L-level, and count signal CNT is at H-level.

In connection with the operations shown in FIGS. 9A and 9B, therefore, control signal CA0 is activated at the first rate, and control signal CA1 is activated at the second rate. Therefore, address bits ADD0 and ADD1 supplied to multi-function pin MPB0 are stored in latch circuits 252 and 254 in response to turn-on of transfer gates TG20 and TG22, respectively, and will be transmitted to address decoder 120.

Owing to the above structure, the one multi-function pin can be used to execute the input of two address bits and the input/output of the one data bit.

Referring to FIG. 10 again, arrows represent signal paths in the address input operation of semiconductor memory device 200. When the address is input, address input enable signal/ADe is active (at L-level), and data I/O enable signal/DQe is inactive (at H-level) so that address register 250 is on, and data input register and data output register are off. Accordingly, the signal supplied to multi-function pin MPB0 is transmitted, as address bits ADD0 and ADD1, to address decoder 120 by input buffer 144 and address register 250.

For the other multi-function pins MPB1–MPB5, there are arranged address registers, data input registers and data output registers in a similar manner. In each of the register circuits corresponding to multi-function pins MPB6 and MPB7 each receiving only one address bit, only the latch circuit corresponding the address bit to be supplied is connected to address decoder 120.

Owing to the above structure, address decoder 120 can receive address bits ADD0–ADD13 via multi-function pins MPB0–MPB7. Data bits D0–D7 and Q0–Q7, of which input and output with respect to memory array 110 are processed by data I/O circuit 130, are externally transmitted via multi-function pins MPB0–MPB7.

Figure 13A:
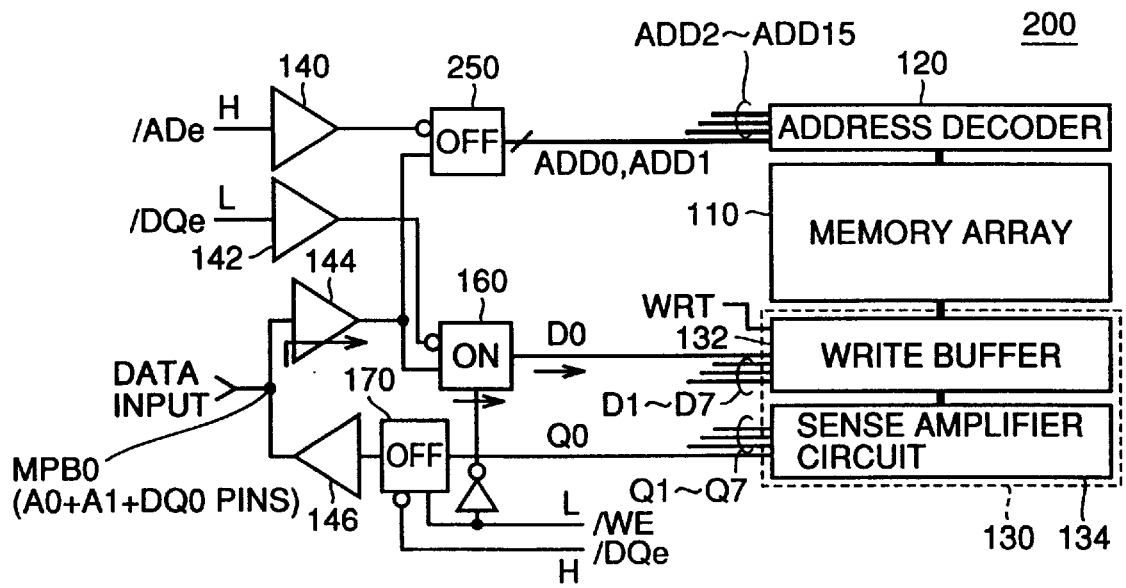
FIGS. 13A and 13B are block diagrams showing signal transmission paths in data write/read operations of semiconductor memory device 200.

FIG. 13A shows flows of signals in the data write operation of semiconductor memory device 200. In the data write operation, address input enable signal/ADe is deactivated (H-level), and data I/O enable signal/DQe is activated (L-level). In the data write operation, I/O control signal/WE is set to L-level for performing writing into the memory array.

In accordance with the above, data input register 160 is turned on, and the data bits supplied to the multi-function pins are transmitted to write buffer 132 via the transfer gates which are selectively turned on. Address register 250 and data output register 170 are turned off. In the data input operation, therefore, the signal supplied to multi-function pin MPB0 is transmitted, as data bit D0, to write buffer 132 via input buffer 144 and data input register 160.

For multi-function pins MPB1–MPB7 other than multi-function pin MPB0, the corresponding data input register circuits execute similar operations, respectively. As a result, the signal supplied via multi-function pins MPB0–MPB7 are written, as data bit D0–D7, into the memory array in the data write operation, in which data I/O control signal/WE is set to L-level at the rate of activation (L-level) of data I/O enable signal/DQe.

Figure 13B:
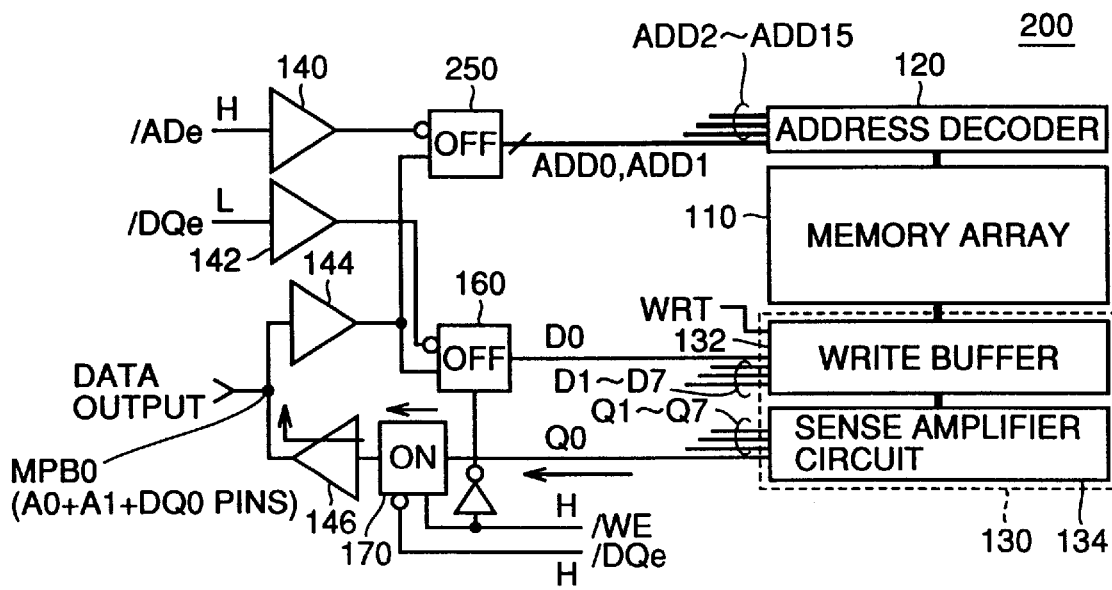

FIG. 13B shows signal transmission paths in the data read operation of semiconductor memory device 200.

In the data read operation, address input enable signal/ADe is set to the inactive state (H-level) and data I/O enable signal/DQe is set to the active state (L-level), similarly to the data write operation. However, I/O control signal/WE is set to H-level for instructing the memory array read operation.

In response to this, data input register 160 and data output register 170 change their states. Thus, data output register 170 is turned on to transmit the data bits, which are issued from sense amplifier circuit 134, to the multi-function pins via the transfer gates which are selectively turned on. Data input register 160 is turned off. Address register 250 is still kept off. In the data output operation, therefore, data bit Q0 read by sense amplifier circuit 134 is issued from multi-function pin MPB0 via data output register 170 and output buffer 146.

In multi-function pins MPB1–MPB7 other than multi-function pin MPB0, the corresponding register circuits perform similar operations, respectively. In the data read operation, therefore, data bits Q0–Q7 are issued from multi-function pins MPB0–MPB7 at the rate where data I/O control signal/WE is set to H-level and data I/O enable signal/DQe is activated.

The structures of the multi-function pins and the respective register circuits of the second embodiment can be applied to the cases, in which the address signal and/or the I/O data signal include bits different in number from those shown in FIGS. 8A and 8B, and can be employed for the multi-function pins each having the integrated functions of performing input of two address bits and input/output of one data bit.

The second embodiment has been described in connection with the structure, in which the multi-function pin performs input/output of the two address bits and one data bit. This structure can be applied to a structure, in which the multi-function pin performs input/output of one data bit and input of address bits of n (n: natural number larger than 3) in number. For this application, n pairs or sets each formed of the latch circuit and the transfer gate are arranged in parallel in the address register, the number L of bits of the count signal is determined to satisfy a relationship of $2L \geq n$, and the transfer gates are successively turned on one by one in response to count-up of the count signal. Thereby, the above application can be performed.

Third Embodiment

As a third embodiment, description will now be given on the case where the I/O data signal is larger in number of bits than the address signal, and particularly will be given on structures of the multi-function pins, which can handle the address signal and the I/O data signal in an integrated manner, as well as register circuits provided corresponding to the respective multi-function pins.

Figure 14B:
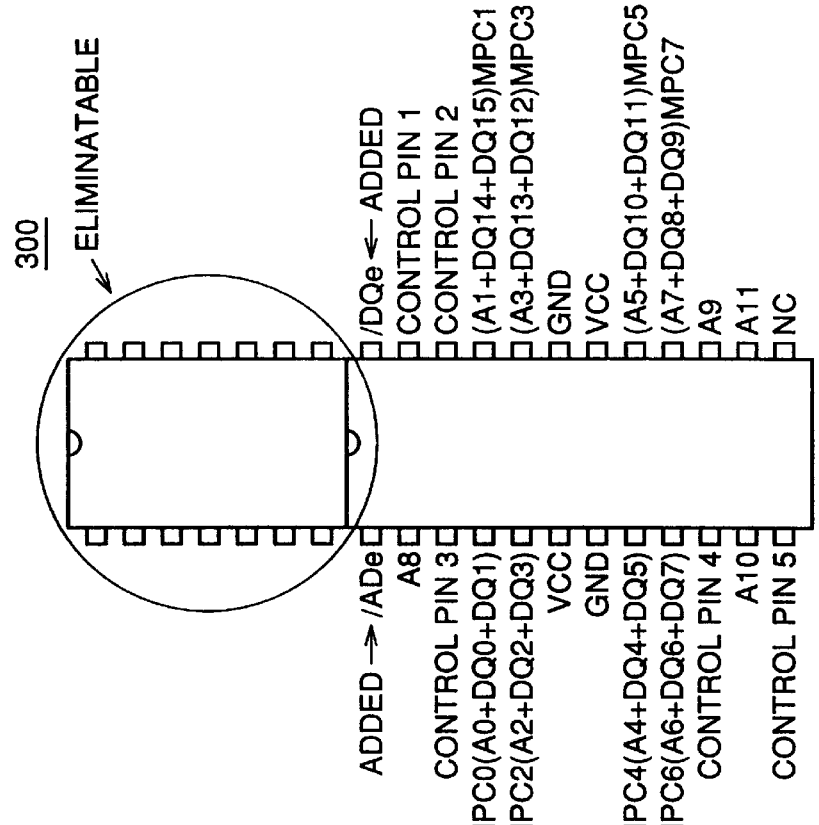
FIGS. 14A and 14B are chip external views showing pin arrangements of a semiconductor memory device 300 according to a third embodiment of the invention.
Figure 14A:
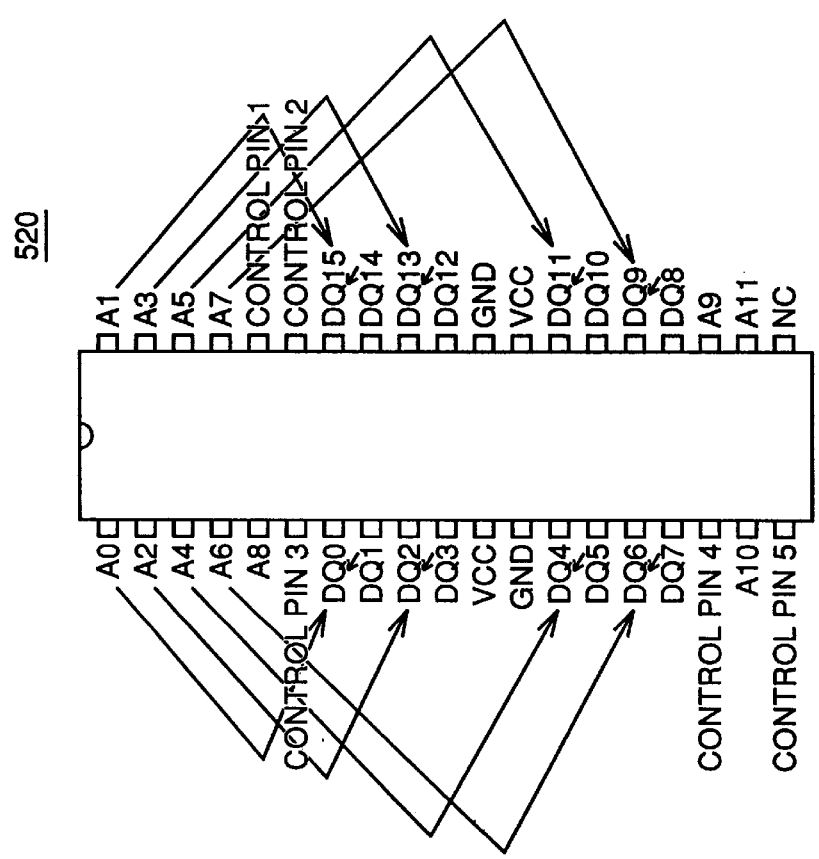

FIG. 14A shows, for comparison, a pin arrangement of a semiconductor memory device 520 in the prior art, which executes input/output of data signal of 16 bits via DQ pins DQ0–DQ15 in response to an address signal of 12 bits supplied through address pins A0–A11. A semiconductor memory device 300 according to the third embodiment has such a distinctive feature that the functions of two DQ pins and one address pin are integrated in the single multi-function pin.

As shown in FIG. 14B, address pins A0–A7 and DQ pins DQ0–DQ15 are replaced with multi-function pins MPC0–MPC7. Each of multi-function pins MPC0–MPC7 executes input/output of two data bits and input of one address bit. For example, multi-function pin MPC0 handles the address bit to be supplied to address pin A0 as well as data bits to be input/output by DQ pins DQ0 and DQ1. Address pins A8–A11 do not have the integrated function because such integration is not required in view of the relationship in number between the address bits and the multi-function pins.

Similarly to semiconductor memory device 100, semiconductor memory device 300 further includes pins for receiving address input enable signal/ADe and data I/O enable signal/DQe.

As described above, the functions of the address input pin and the data I/O pins are integrated in the multi-function pins. Therefore, the pins for inputting address input enable signal/ADe and data I/O enable signal/DQe increase by two, but the address pins and the data I/O pins can be reduced by 16 so that the total number of the pins can be reduced by 14.

As a typical example, input/output operations via one of the multi-function pins, i.e., multi-function pin MPC0 receiving two data bits and address pin A9 will now be described with reference to FIGS. 15A and 15B.

In semiconductor memory device 300, the multi-function pin handles one address bit and two data bits, and therefore execute the input/output of the three bits in total. Therefore, semiconductor memory device 300 executes the data write operation handling the three rates as one set.

Figure 15A:
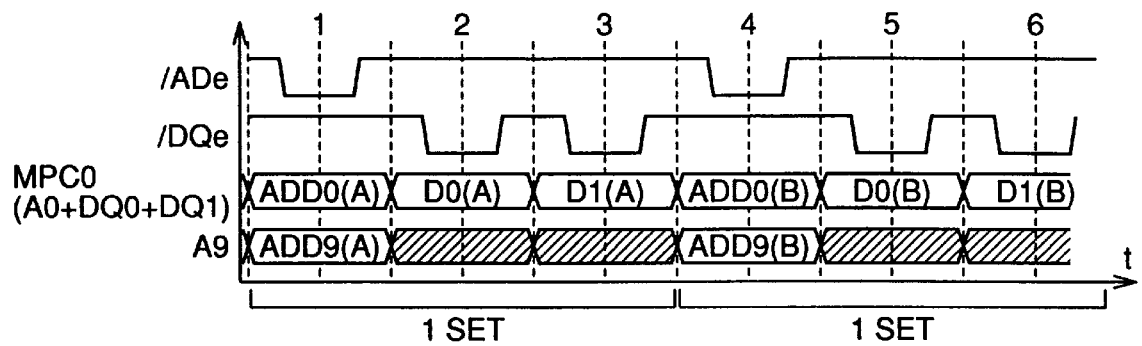
FIGS. 15A and 15B are timing charts showing address input and data write/read in semiconductor memory device 300.

FIG. 15A is a timing chart showing address input and data input/output of semiconductor memory device 300 in the data write operation.

At the first rate in FIG. 15A, address input enable signal/ADe is activated, and each bit of address signal ADD(A) is supplied. Multi-function pin MPC0 and address pin A9 receive address bits ADD0(A) and ADD9(A), respectively.

At the second and third rates, data I/O enable signal/DQe is activated, and respective bits D0–D15 of the data signal are supplied. In response to this, multi-function pin MPC0 receives data bit D0(A) at the second rate, and receives data bit D1(A) at the third rate. However, address pin A9 does not receive the data signal because it is configured to perform only the input of address signal.

In the fourth, fifth and sixth rates, signals are supplied in a similar manner. At the fourth rate, the respective bits of address signal ADD(B) are supplied in response to activation of address input enable signal/ADe, and multi-function pin MPC0 and address pin A9 are supplied with address bits ADD0(B) and ADD9(B), respectively. At the fifth and sixth rates, respective bits D0–D15 of the data signal are supplied. In response to activation of data I/O enable signal/DQe, multi-function pin MPC0 receives data bit D0(B) at the fifth rate, and receives data bit D1(B) at the sixth rate. Address pin A9 dedicated to input of the address signal does not receive the data signal.

Figure 15B:
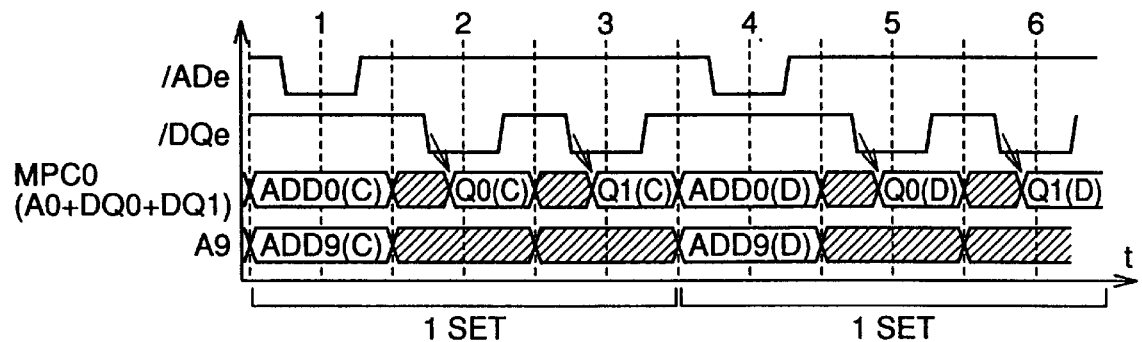

FIG. 15B shows input/output of signals via multi-function pin MPC0 and address pin A9 in the data read operation.

Referring to FIG. 15B, address signal ADD(C) is supplied at the first rate in response to activation of address input enable signal/ADe. Thereby, multi-function pin MPC0 receives address bit ADD0(C), and address pin A9 receives address bit ADD9(C).

In accordance with address signal ADD(C) supplied at the first rate, data signal Q(C) is issued in response to activation of data I/O enable signal/DQe at the second and third rates. Multi-function pin MPC0 issues data bit Q0(C) at the second rate, and issues data bit Q1(C) at the third rate. Address pin A9 is not used for data output. At the fourth through sixth rates, similar operations are performed, and output of data signal Q(D) according to address signal ADD(D) is executed.

Figure 16:
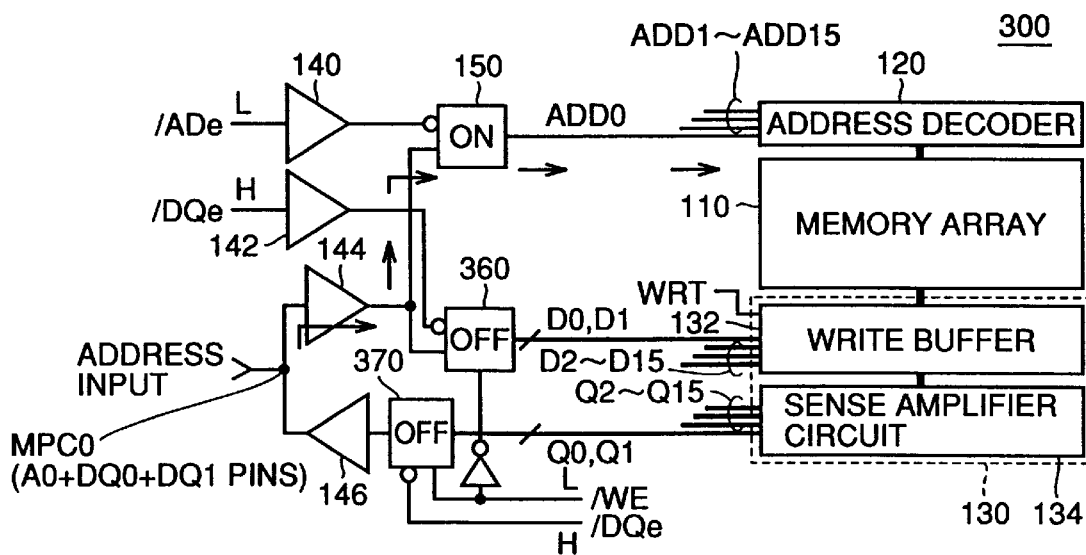
FIG. 16 is a schematic block diagram showing a whole structure of semiconductor memory device 300 and signal transmission paths in an address input operation.

FIG. 16 is a schematic block diagram showing a whole structure of semiconductor memory device 300 as well as signal transmission paths in the address input operation.

Referring to FIG. 16, semiconductor memory device 300 differs from semiconductor memory device 100 of the first embodiment in that data input register 160 is replaced with a data input register 360, and data output register 170 is replaced with a data output register 370. Data input register 360 and data output register 370 are provided for such a feature that multi-function pin MPC0 receives the two data bits. Circuit structures and operations of semiconductor memory device 300 other than the above are the same as those of semiconductor memory device 100 except for the number of bits of the address signal applied to the address decoder. Therefore, description thereof is not repeated.

Figure 17A:
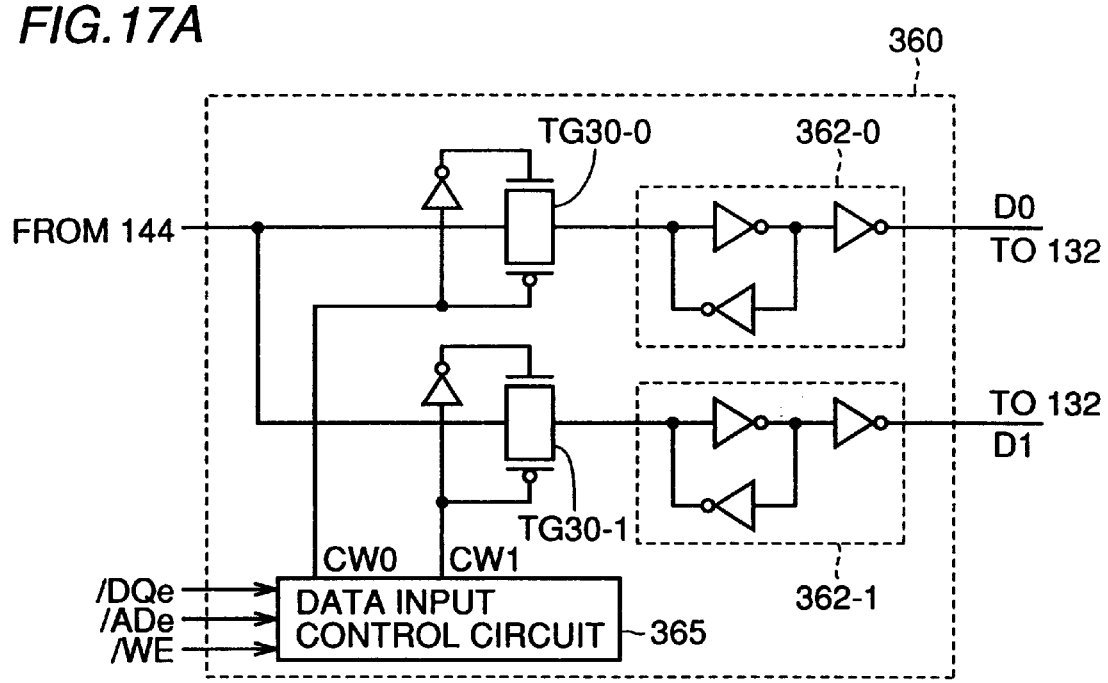
FIGS. 17A and 17B are circuit diagrams showing structures of a data input register 360 and a data output register 370.

Referring to FIG. 17A, data input register 360 includes latch circuits 362-0 and 362-1 for latching the signal levels issued from input buffer 144, a transfer gate TG30-0 connected between input buffer 144 and latch circuit 362-0, and a transfer gate TG30-1 connected between input buffer 144 and latch circuit 362-1. Data input register 360 further includes a data input control circuit 365 which issues control signals CW0 and CW1 for controlling on/off of transfer gates TG30-0 and TG30-1, respectively.

Figure 18:
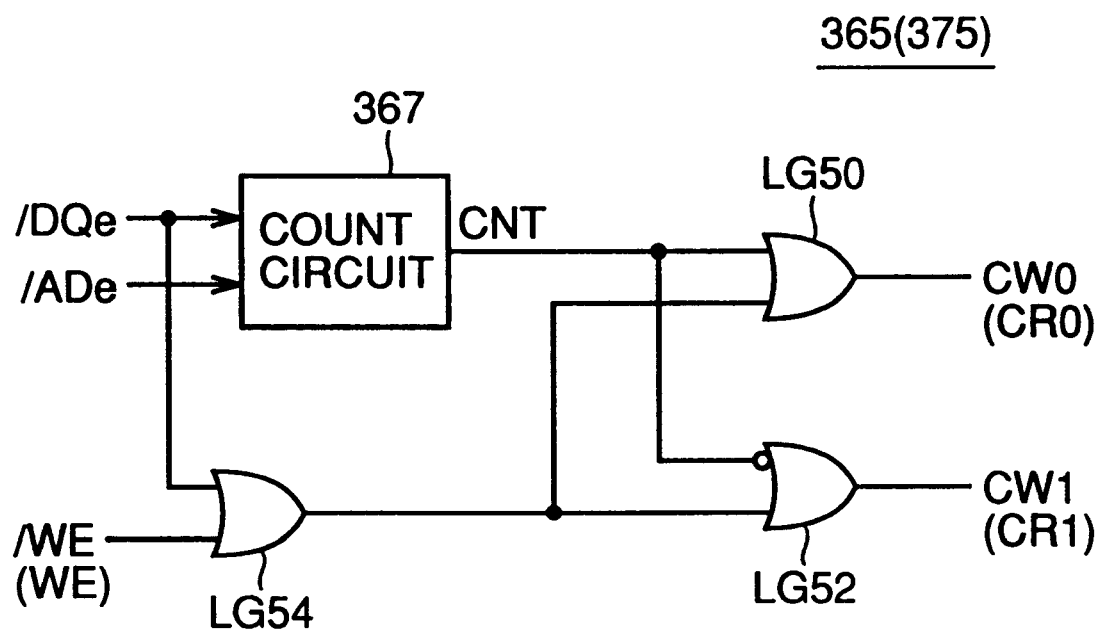
FIG. 18 is a circuit diagram showing structures of a data input control circuit 365 and a data output control circuit 375.

Referring to FIG. 18, data input control circuit 365 includes a count circuit 367 which receives data I/O enable signal/DQe and address input enable signal/ADe, and sets the signal level of count signal CNT of one bit, a logic gate LG54 which issues a result of logical OR between data I/O enable signal/DQe and I/O control signal/WE, and logic gates LG50 and LG52 which issue control signals CW0 and CW1, respectively, in response to count signal CNT and the output of logic gate LG54.

Count circuit 367 clears and sets count signal CNT to L-level upon every activation of address input enable signal/ADe, and inverts the signal level of count signal CNT in accordance with the timing of deactivation (H-level) of data I/O enable signal/DQe after it was once activated to attain L-level.

Data I/O control circuit 365 activates one of control signals CW0 and CW1 in accordance with the signal level of count signal CNT in the case where I/O control signal/WE is set to L-level instructing the data input at the rate of activation of data I/O enable signal/DQe.

Referring to FIG. 17A again, while transfer gate TG30-0 is on in response to activation of control signal CW0, the data signal, which is supplied to multi-function pin MPC0 and is transmitted by input buffer 144, is latched by latch circuit 362-0, and is transmitted as data bit D0 to write buffer 132. When control signal CW1 is active, transfer gate TG30-1 is on so that the data signal transmitted from the input buffer is latched by latch circuit 362-1, and is transmitted as data bit D1 to write buffer 132.

Figure 17B:
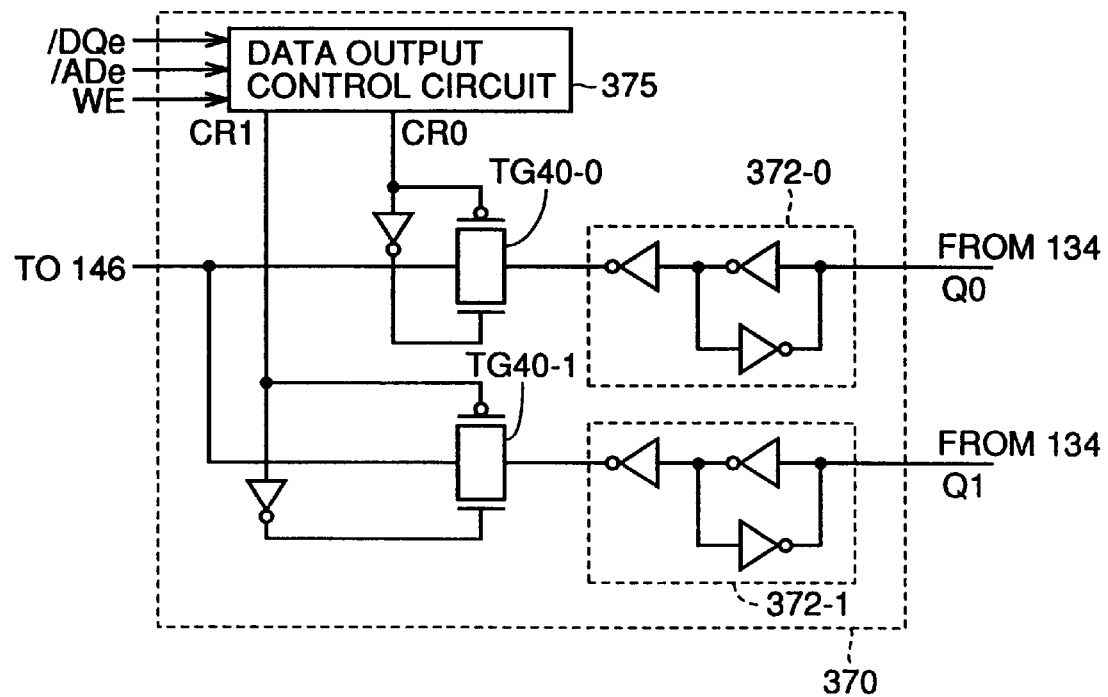

Referring to FIG. 17B, data output register 370 includes latch circuits 372-0 and 372-1 for latching data bits Q0 and Q1 issued from sense amplifier circuit 134, a transfer gate TG40-0 arranged between latch circuit 372-0 and output buffer 146, and a transfer gate TG40-1 arranged between latch circuit 372-1 and output buffer 146.

On/off of transfer gates TG40-0 and TG40-1 are controlled by control signals CR0 and CR1, respectively. Data output register 370 further includes a data output control circuit 375 issuing control signals CR0 and CR1.

Referring to FIG. 18 again, data output control circuit 375 has a structure similar to that of data input control circuit 365 except for that one of outputs of logic gate LG54 is not I/O control signal/WE but is an inverted signal WE thereof. Owing to this structure, one of control signals CR0 and CR1 is activated (L-level) in response to the signal level of count signal CNT in the case where I/O control signal/WE is set to H-level (i.e., signal WE is set to L-level) instructing data reading at the rate of active state of data I/O enable signal/DQe.

Referring to FIG. 17B again, when transfer gate TG40-0 turns on in accordance with control signal CR0, data bit Q0 latched by latch circuit 372-0 is issued to multi-function pin MPC0 via output buffer 146. Likewise, when transfer gate TG40-1 turns on in accordance with control signal CR1, data bit Q1 latched by latch circuit 372-1 is issued to multi-function pin MPC0 via output buffer 146.

Owing to the above structure, one multi-function pin MPC0 can execute input/output of two data bits.

Data input registers 360 and data output registers 370 having structures similar to the above are provided for the other multi-function pins MPC1–MPC7.

Figure 19A:
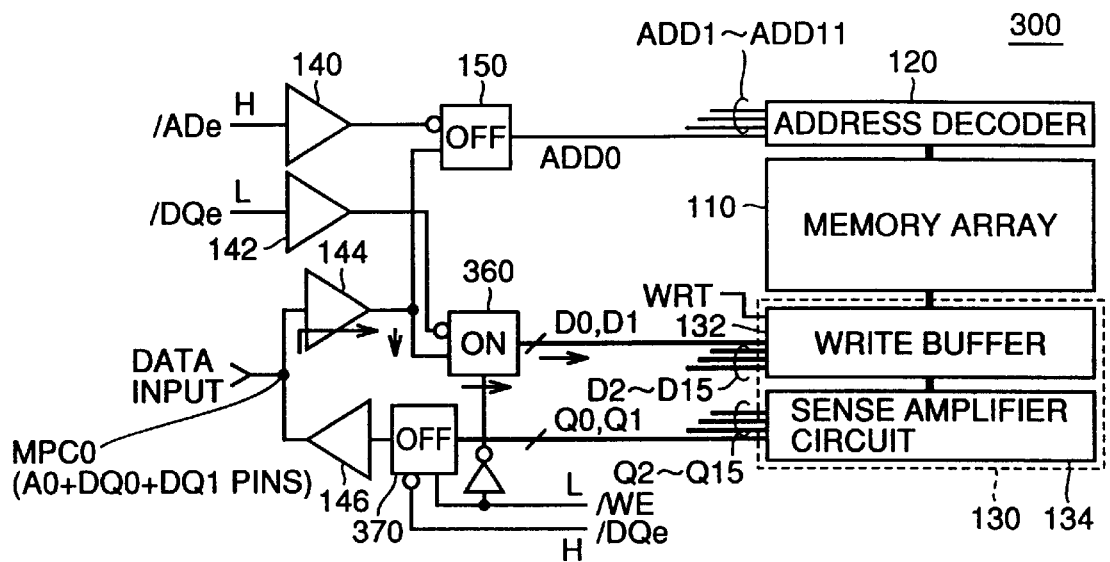
FIGS. 19A and 19B are block diagrams showing signal transmission paths in data write/read operations of semiconductor memory device 300.

FIG. 19A shows signal transmission paths in the data write operation. In this case, address input enable signal address/ADe is set to the inactive state (H-level), data I/O enable signal/DQe is set to the active state (L-level) and I/O control signal/WE is set to L-level. In accordance with these states, address register 150 and data output register 370 are turned off. Data input register 360 is turned on so that the data bit supplied to the multi-function pin is transmitted to write buffer 132 via the transfers gate which are selectively turned on.

Thereby, data bits D0 and D1 supplied to multi-function pin MPC0 are transmitted to write buffer 132. FIG. 19A shows, as a typical example, transmission paths of the data bits supplied to multi-function pin MPC0.

Figure 19B:
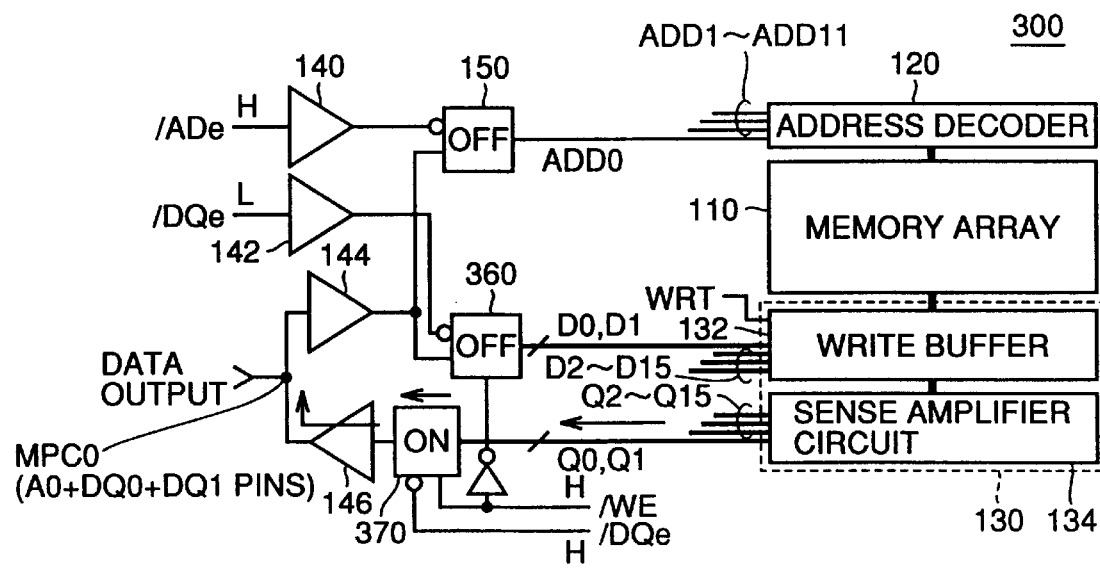

FIG. 19B shows transmission paths for signals issued from multi-function pin MPC0 in the data read operation. In this case, address input enable signal/ADe is inactive (H-level), data I/O enable signal/DQe is active (L-level), and I/O control signal/WE is at H-level. In accordance with these states, address register 150 and data input register 360 are turned off, and data output register 370 is turned on so that the data bit issued from sense amplifier circuit 134 is transmitted to the multi-function pin via the selected latch circuit.

Thereby, data bits Q0 and Q1 to be issued from multi-function pin MPC0 are transmitted from sense amplifier circuit 134 to output buffer 146. FIG. 19B shows, as a typical example, transmission paths of the data bits sent via multi-function pin MPC0.

The structures of the multi-function pins and the register circuits in the third embodiment can also be applied to such a structure that the multi-function pin is employed for integrating the function of inputting the one address bit and the function of performing input/output of the two data bits, even if the numbers of bits of the address signal and bits of the I/O data signal are different from those in FIGS. 14A and 14B.

The third embodiment has been described in connection with the structure, in which the multi-function pin performs input/output of the one address bit and two data bits. This structure can be applied to a structure, in which the multi-function pin performs input of one address bit and input/output of data bits of n (n: natural number larger than 3) in number.

For this application, n pairs or sets each formed of the latch circuit and the transfer gate are arranged in parallel in each of the address input register and data output register shown in FIGS. 17A and 17B, the number L of bits of the count signals, which are issued in the data input control circuit and the data output control circuit, is determined to satisfy a relationship of $2L \geq n$, and the transfer gates are successively turned on one by one in response to count-up of the count signal. By employing the above structure for controlling signal transmission between each of the n latch circuits and the input or output buffer, the above application can be performed.

Fourth Embodiment

FIG. 20A shows, for comparison, a semiconductor memory device 500 in the prior art, which has 16 address pins A0–A15 for input of address bits, and 16 data DQ pins DQ0–DQ15 for input/output of data bits.

In a semiconductor memory device 400 shown in FIG. 20B, the functions of such 16 address input pins and 16 data I/O pins are integrated in a single multi-function pin MPD. This structure allows significant reduction in number of pins.

Figure 21A:
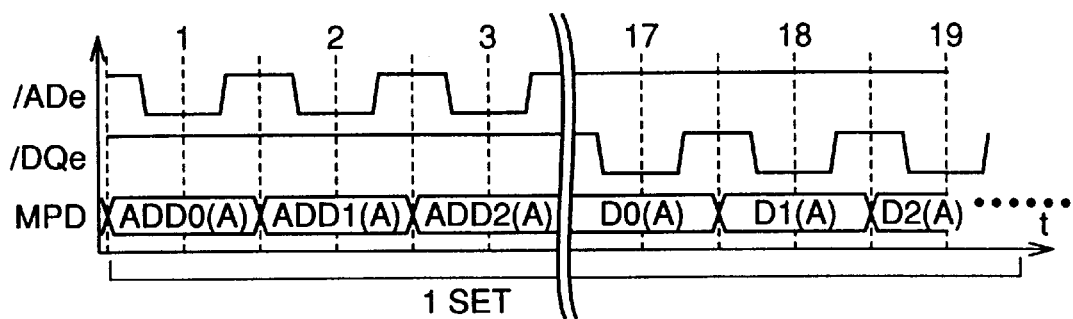
FIGS. 21A and 21B are timing charts showing address input and data write/read operations of semiconductor memory device 400.

FIG. 21A shows address input and data input/output in the data write operation. In semiconductor memory device 400, the address signal of 16 bits is input via single multi-function pin MPD. For allowing this, address bits ADD0(A)–ADD15(A) are successively supplied in response to activation of address input enable signal/ADe at the first to sixteenth rates, respectively.

Thereafter, the write data corresponding to address ADD (A) is supplied at 16 rates from the seventeenth rate to thirty-second rate. Thus, semiconductor memory device 400 executes the write operation handling thirty-two rates as one set.

Figure 21B:
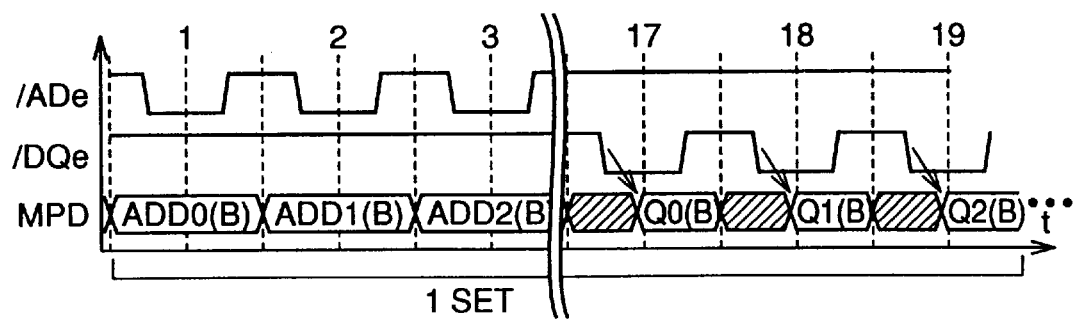

FIG. 21B shows timing of address input and data output in the data read operation. Address bits ADD0(B)–ADD15 (B) are supplied in response to activation of address input enable signal/ADe at the first to sixteenth rates, respectively.

Data reading corresponding to address ADD(B) is executed in memory array, and the read data is issued from multi-function pin MPD for 16 rates from seventeenth rate to thirty-second rate. Thus, semiconductor memory device 400 performs the read operation handling 32 rates as one set.

Figure 22:
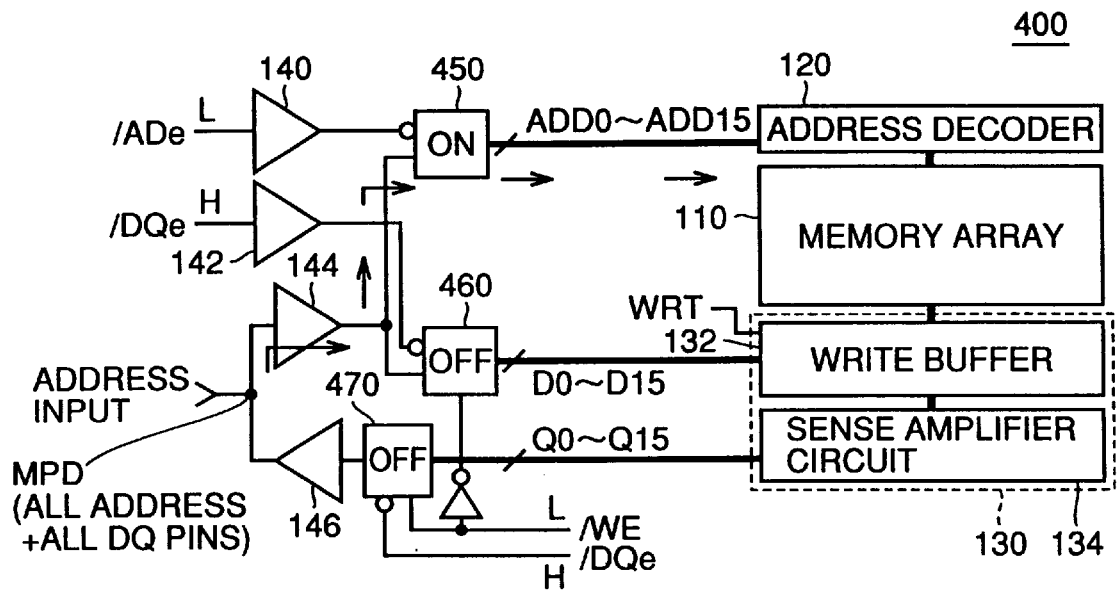
FIG. 22 is a schematic block diagram showing a whole structure of semiconductor memory device 400 and signal transmission paths in an address input operation.

FIG. 22 is a schematic block diagram showing a whole structure of semiconductor memory device 400 and signal transmission paths in the address input operation.

Referring to FIG. 22, semiconductor memory device 400 differs from semiconductor memory device 100 according to the first embodiment shown in FIG. 3 in that an address register 450, a data input register 460 and a data output register 470 are employed instead of address register 150, data input register 160 and data output register 170, respectively.

Address register 450 is provided for such a feature that multi-function pin MPD is supplied with 16 address bits. Data input register 460 and data output register 470 are provided for such a feature that multi-function pin MPD performs input/output of 16 data bits.

The circuit structures and operations other than the above are similar to those of semiconductor memory device 100 according to the first embodiment, and therefore description thereof is not repeated.

Figure 23:
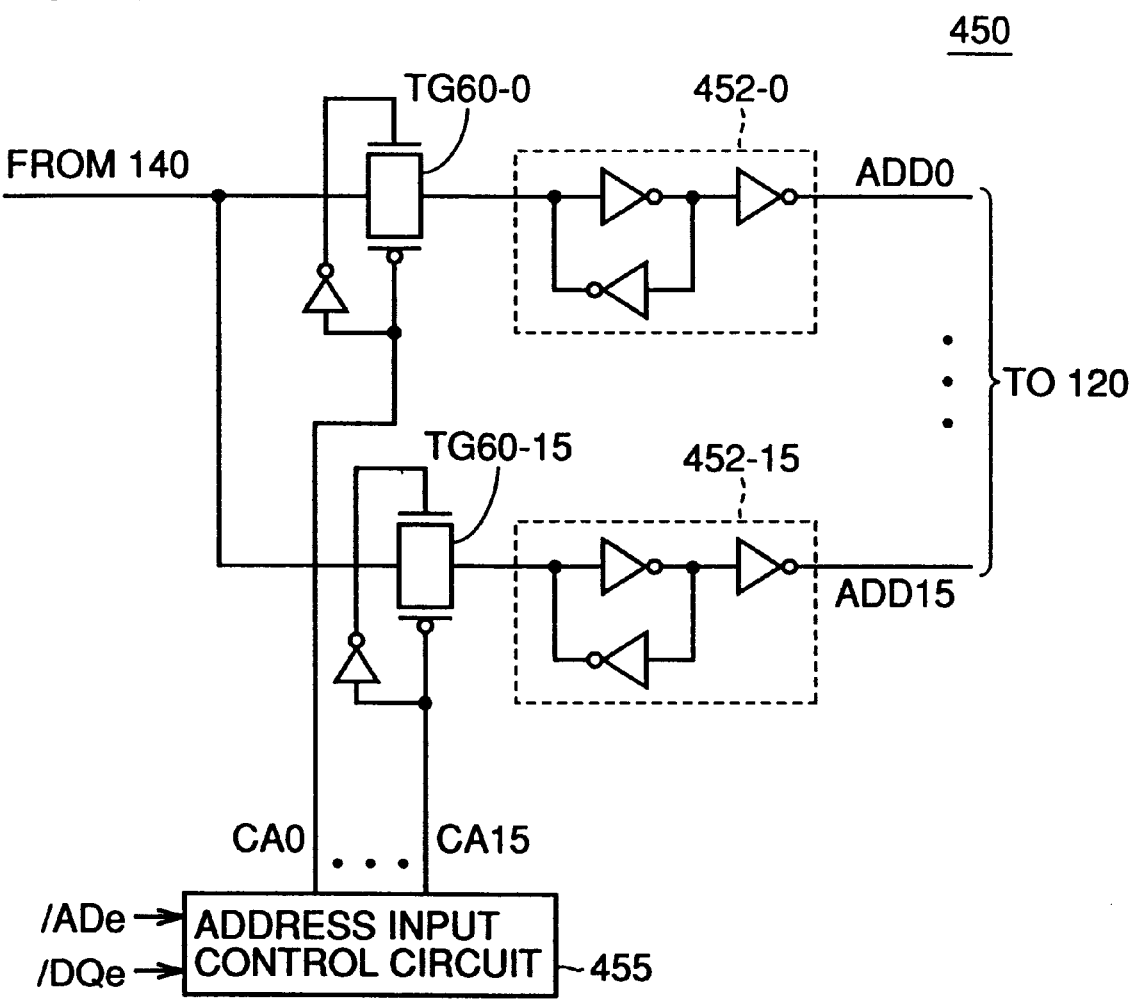
FIG. 23 is a circuit diagram showing a structure of an address register 450.

Referring to FIG. 23, address register 450 includes latch circuits 452-0–452-15 for latching address bits ADD0–ADD15, respectively, and also includes transfer gates TG60-0–TG60-15 provided corresponding to the latch circuits, respectively. On/off of transfer gates TG60-0–TG60-15 are controlled in response to control signals CA0–CA15, respectively.

Address input control circuit 455 activates one of control signals CA0–CA15 to attain L-level at the rate of activation (L-level) of address input enable signal/ADe in response to a count signal of 4 bits, which is counted up in response to address input enable signal/ADe and is initialized in response to activation of data I/O enable signal/DQe. In response to this, the address bit, which is transmitted from data input buffer 144 and is supplied to multi-function pin MPD, is stored in the corresponding latch circuit, and is transmitted to address decoder 120.

The structure of address register 450 shown in FIG. 23 can be applied to the case where input of the address bits of n (n: natural number of 2 or more) is performed by one multi-function pin. This is allowed by appropriately setting the number of bits of the count signal, and thereby appropriately setting the number of pairs, which are arranged in parallel and each include the latch circuit and the transfer gate. The circuit structure of address input control circuit 455 for the above cases can be achieved in a circuit corresponding to that shown in FIG. 12 by increasing the number of logic gates corresponding to logic gates LG20 and LG22 in accordance with the number of bits of the count signal.

Figure 24A:
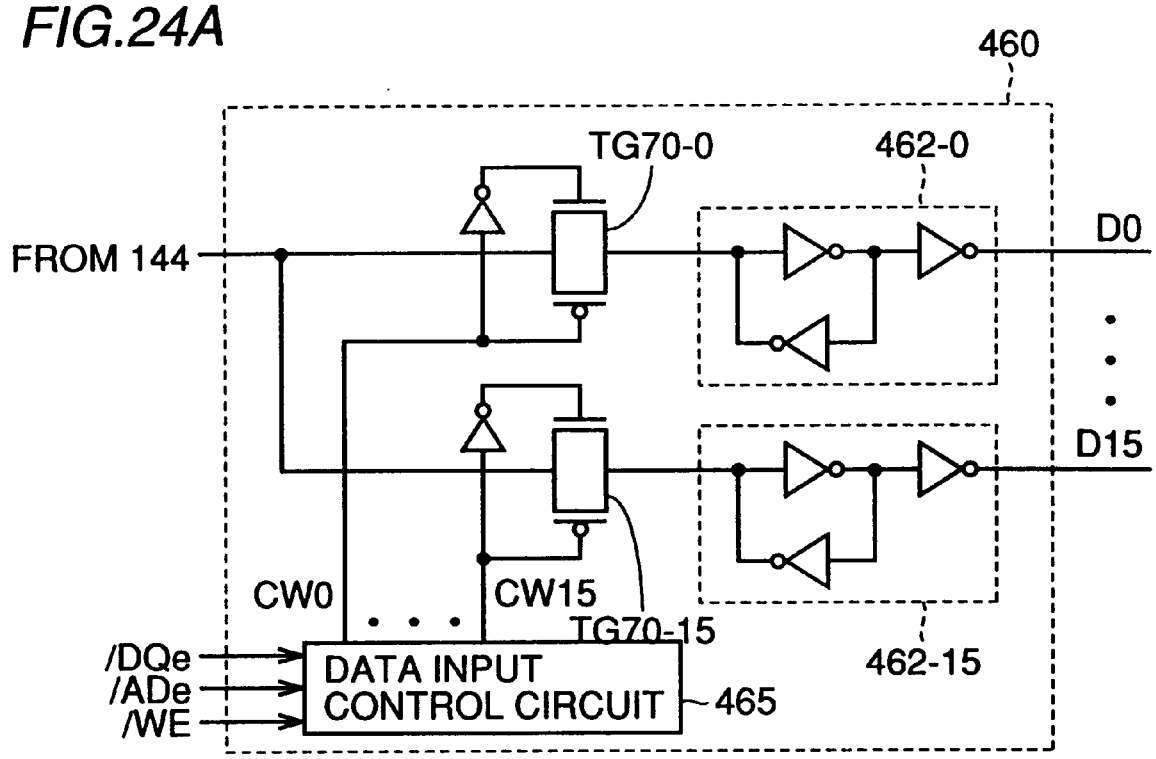
FIGS. 24A and 24B are circuit diagrams showing structures of a data input register 460 and a data output register 470.

Referring to FIG. 24A, data input register 460 includes latch circuits 462-0–462-15 provided for latching data bits D0–D15, respectively, and also includes transfer gates TG70-0–TG70-15 provided corresponding to the latch circuits, respectively. Transfer gates TG70-0–TG70-15 are turned on/off in response to control signals CW0–CW15 issued from data I/O control circuit 465, respectively.

Data I/O control circuit 365 counts up the count signal represented by four bits at every rate when data I/O enable signal/DQe is in the active state instructing the write operation, and activates one of control signals CW0–CW15 to attain L-level in response to the above count-up. The count signal is initialized in response to activation of address input enable signal/ADe.

Owing to the above structure, the data bit supplied to multi-function pin MPD is stored in the predetermined latch circuit via input buffer 144, and is transmitted to write buffer 132.

Figure 24B:
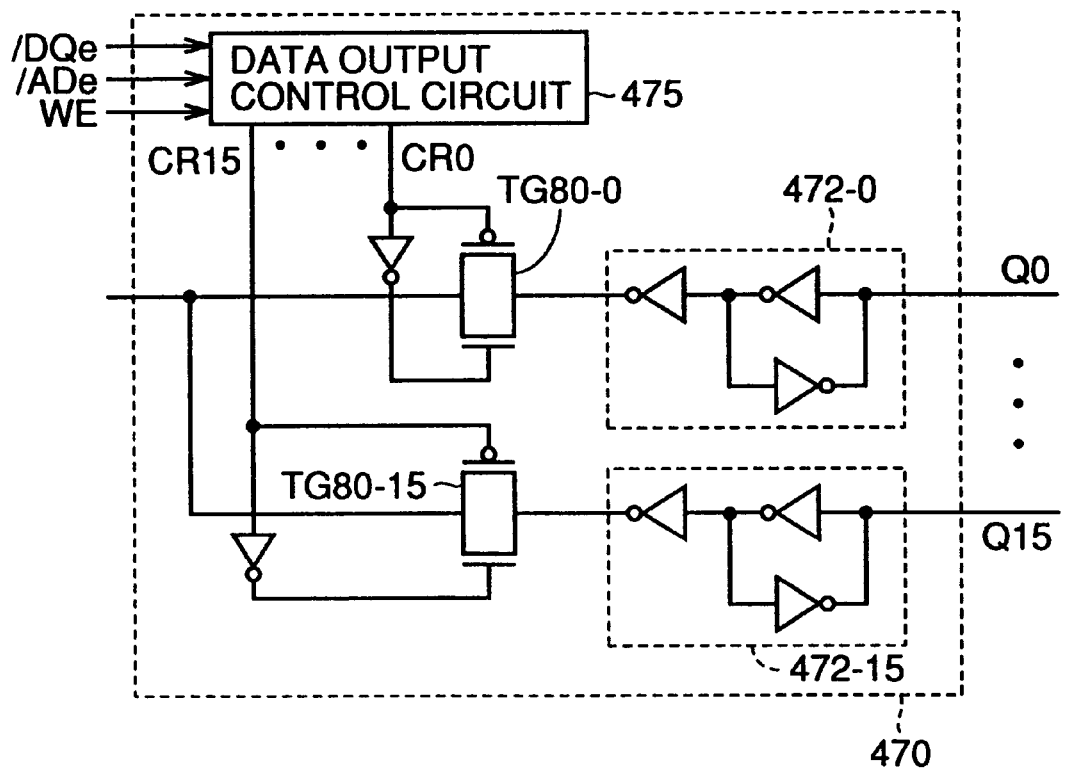

Referring to FIG. 24B, data output register 470 includes latch circuits 472-0–472-15 provided for data bits Q0–Q15, respectively, and transfer gates TG80-0–TG80-15 provided corresponding to the latch circuits, respectively. Transfer gates TG80-0–TG80-15 are turned on/off in response to control signals CR0–CR15.

Data output control circuit 475 activates (sets to L-level) one of control signals CR0–CR15 in response to the count signal (4 bits), which is counted up at every rate, in the data read operation when data I/O enable signal/DQe is activated (L-level) and I/O control signal/WE is set to H-level (i.e., signal WE is set to L-level).

In response to this, one of the data bits Q0–Q15 is issued to multi-function pin MPD at the corresponding rate in the data read operation. Similarly to the data input control circuit, the count signal is initialized in response to activation of address input enable signal/ADe.

The circuit structures of data input control circuit 465 and data output control circuit 475 can be achieved by a circuit corresponding to that shown in FIG. 18, in which the logic gates corresponding to logic gates LG50 and LG52 are increased in number in accordance with the bit number of the count signal.

Figure 25A:
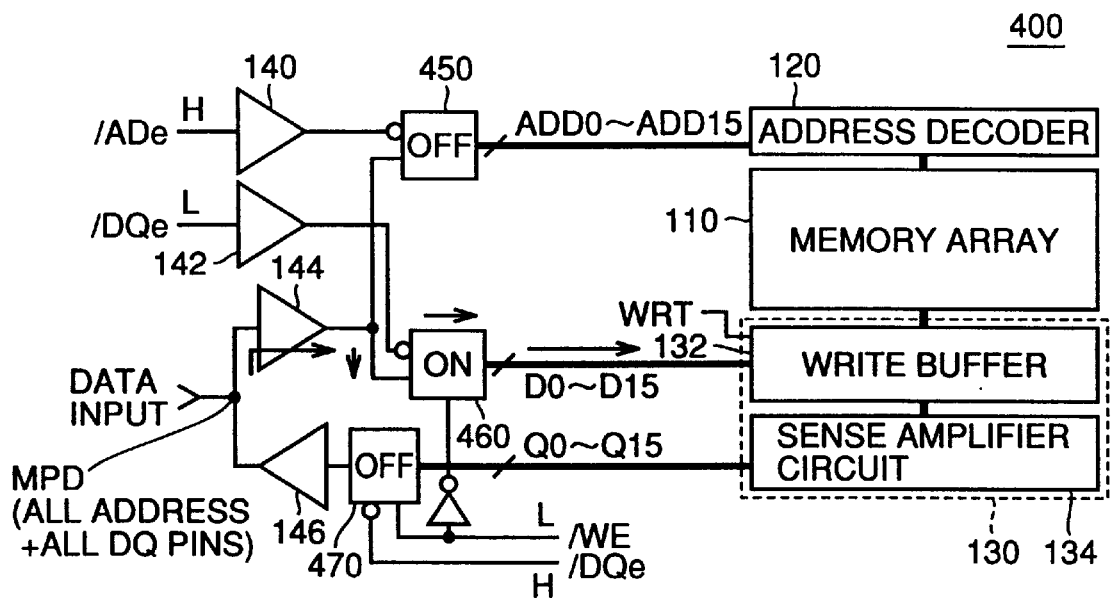
FIGS. 25A and 25B are block diagrams showing signal transmission paths in data write/read operations of semiconductor memory device 400.

FIG. 25A shows signal transmission paths in the data write operation. In the data input operation, as shown in FIG. 25A, address input enable signal/ADe and data I/O enable signal/DQe are set to the inactive state (H-level) and the active state (L-level), respectively, and I/O control signal/WE is set to L-level.

In response to this, address register 450 and data output register 470 are turned off, and data input register 460 is turned on. Thereby, respective bits D0–D15 of the data input signal supplied to multi-function pin MPD are sent to write buffer 132 via the transfer gates, which are selectively turned on, in data input register 460, and are written into memory array 110.

Figure 25B:
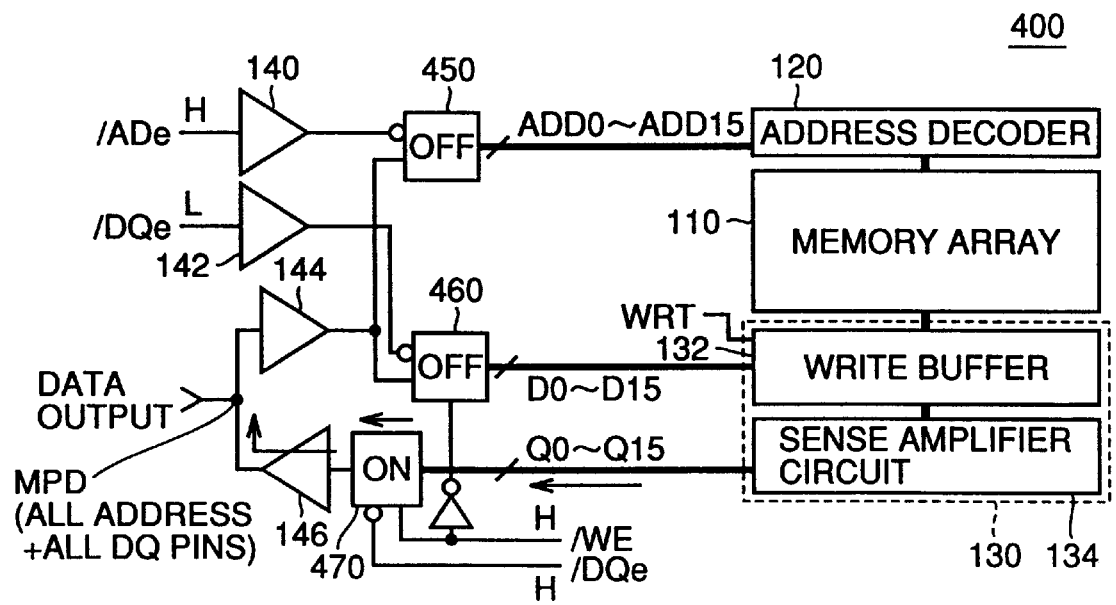
Figure 26:
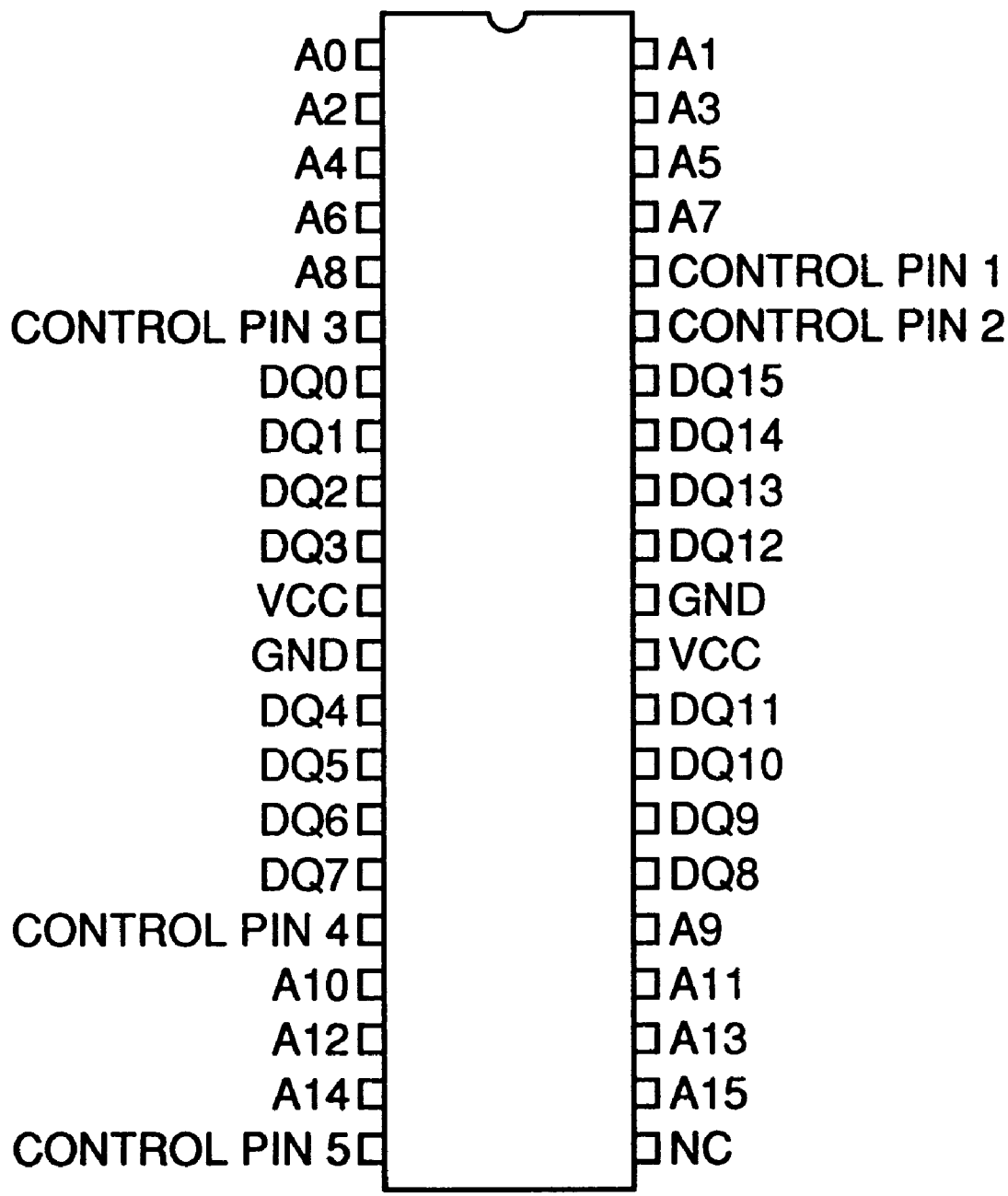
FIG. 26 is a chip external view showing a pin arrangement of a semiconductor memory device 500 in the prior art.

FIG. 25B shows signal transmission paths in the data read operation. Referring to FIG. 25B, I/O control signal/WE is set to H-level in the data output operation. In response to this, data input register 460 is turned off, and data output register 470 is turned on.

In response to this, data bits Q0–Q15 which are read from memory array 110 and are amplified by sense amplifier circuit 134, are successively transmitted one bit by one bit to output buffer 164 via the transfer gates, which are selectively turned on, in data output register 470 at every rate, and are issued from multi-function pin MPD.

In the fourth embodiment, all the address bits and all the data bits are transmitted via the single multi-function pin. However, the invention is not restricted to this structure. The invention can be applied to various structures provided that the multi-function pin handles multiple address bits and multiple data bits.

The above application is allowed by appropriately setting the number of pairs, which are arranged in parallel and each include the latch circuit and the transfer gate, in accordance with the number of the address bits and the number of data bits handled by the multi-function pin so that the transfer gates are successively turned on in response to the count signal corresponding to the above bit numbers, as already described.

Although description has been given by way of example on the embodiments relating to the asynchronous SRAMs, the invention is not restricted to them. The invention can be widely applied to various semiconductor memory devices, which externally transmit the address signals and the data signals via pins.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device for performing input/output of a data signal of M bit(s) (M: natural number) in response to an address signal of N bit(s) (N: natural number), comprising:

a memory cell array having a plurality of memory cells arranged in rows and columns;

an address decode circuit for selecting the memory cells of M in number from said plurality of memory cells in response to a combination of the respective bits of said address signal;

a data I/O circuit for performing data input/output with respect to said selected M memory cells;

a plurality of multi-function terminals commonly used by the input of said address signal and the input/output of said data signal;

a first control terminal for receiving a first control signal/ADe for instructing input of said address signal to said plurality of multi-function terminals;

a second control terminal/DQe for receiving of a second control signal for instructing input/output of said data signal to said plurality of multi-function terminals;

a plurality of address register circuits provided between said plurality of multi-function terminals and said address decode circuit, respectively, and responding to activation of said first control signal by taking in the level of the signal supplied to said plurality of multi-function terminals, and transmitting said level to said address decode circuit; and a plurality of data register circuits provided between said plurality of multi-function terminals and said data I/O circuit, respectively, and responding to the activation of said second control signal by transmitting said data signal between said plurality of multi-function terminals and said data I/O circuit.

2. The semiconductor memory device according to claim 1, wherein each of said data register circuits includes:

an input data register for transmitting the signal level supplied to corresponding one of said plurality of multi-function terminals to said data I/O circuit when data write is instructed to said memory cell array; and an output data register for transmitting the signal level output from said data I/O circuit to the corresponding one of said plurality of multi-function terminals when data read is instructed to said memory cell array.

3. The semiconductor memory device according to claim 2, wherein at least one of said plurality of multi-function terminals executes input of one bit of said address signal and input/output of one bit of said data signal, said semiconductor memory device includes the one address register, the one input data register and the one output data register for each of said at least one of said plurality of multi-function terminals, and one of said input data register and said output data register operates in response to a third control signal/WE indicating which of said data read and said data write is to be performed on said memory cell array, when said second control signal is active.

4. The semiconductor memory device according to claim 3, wherein said address signal is equal in number of bits to said data signal.

5. The semiconductor memory device according to claim 2, wherein at least one of said plurality of multi-function terminals executes input of one bit in said address signal and J bits (J: natural number not exceeding N) in said data signal;

said input data register provided corresponding to each of said at least one of said plurality of multi-function terminals includes:

J sets connected in parallel between a corresponding one of multi-function terminals and said data I/O circuit, respectively, and each including a first transfer gate and a first latch circuit, and a data input control circuit for selectively turning on one of said J first transfer gates when said second control signal is active and said data write in instructed; and said output data register provided corresponding to each of said at least one of said plurality of multi-function terminals includes:

J sets connected in parallel between the corresponding one of multi-function terminals and said data I/O circuit, respectively, and each including a second transfer gate and a second latch circuit, and a data output control circuit for selectively turning on one of said J second transfer gates when said second control signal is active and said data read in instructed.

6. The semiconductor memory device according to claim 5, wherein said data input control circuit includes a count circuit issuing a count signal of L bits (L: natural number satisfying $2L \geq J$), said count circuit initializes said count signal in response to said first control signal, and counts up said count signal in response to said second control signal, and said data input control circuit selectively turns on one of said J first transfer gates in accordance with a combination of the signal levels of the respective bits of said count signal when said second control signal is active, and said third control signal instructs said data write.

7. The semiconductor memory device according to claim 5, wherein said data output control circuit includes a count circuit issuing a count signal of L bits (L: natural number satisfying $2L \geq I$), said count circuit initializes said count signal in response to said first control signal, and counts up said count signal in response to said second control signal, and said data output control circuit selectively turns on one of said J second transfer gates in accordance with a combination of the signal levels of the respective bits of said count signal when said second control signal is active, and said third control signal instructs said data read.

8. The semiconductor memory device according to claim 7, wherein said data signal is larger in number of bits than said address signal.

9. The semiconductor memory device according to claim 2, wherein at least one of said plurality of multi-function terminals executes input of I bits (I: natural number not exceeding M) in said address signal and input/output of J bits in said data signal;

said address register provided corresponding to each of said at least one of said plurality of multi-function terminals includes:

I sets arranged in parallel between a corresponding one of said multi-function terminals and said address decoder, and each including a first transfer gate and a first latch circuit, and an address input control circuit for selectively operating one of said I first transfer gates when said first control signal is active;

said data input register provided corresponding to each of said at least one of said plurality of multi-function terminals includes:

J sets arranged in parallel between the corresponding one of said multi-function terminals and said data I/O circuit, and each including a second transfer gate and a second latch circuit, and a data input control circuit for selectively turning on one of said J second transfer gates when said second control signal is active, and said data write is instructed; and said data output register provided corresponding to each of said at least one of said plurality of multi-function terminals includes:

J sets arranged in parallel between the corresponding one of said multi-function terminals and said data I/O circuit, and each including a third transfer gate and a third latch circuit, and a data output control circuit for selectively turning on one of said J third transfer gates when said second control signal is active, and said data read is instructed.

10. The semiconductor memory device according to claim 1, wherein at least one of said plurality of multi-function terminals executes input of I bits (I: natural number not exceeding M) in said address signal and input/output of 1 bit in said data signal; and said address register provided corresponding to each of said at least one of said plurality of multi-function terminals includes:

I sets arranged in parallel between a corresponding one of said multi-function terminals and said address decoder, and each including a transfer gate and a latch circuit, and an address input control circuit for selectively turning on one of said I transfer gates when said first control signal is active.

11. The semiconductor memory device according to claim 10, wherein said address input control circuit includes a count circuit issuing a count signal of K bits (K: natural number satisfying $2K \geq J$), said count circuit initializes said count signal in response to said second control signal, and counts up said count signal in response to said first control signal, and said address input control circuit selectively turns on one of said I transfer gates in accordance with a combination of the signal levels of the respective bits of said count signal when said first control signal is active.

12. The semiconductor memory device according to claim 10, wherein said address signal is larger in number of bits than said data signal.

* * * * *